United States Patent
Yoshiura

(10) Patent No.: US 10,663,518 B2
(45) Date of Patent: May 26, 2020

(54) ABNORMALITY DETERMINING APPARATUS, ABNORMALITY DETERMINING METHOD, AND ABNORMALITY DETERMINING SYSTEM

(71) Applicant: KABUSHIKI KAISHA YASKAWA DENKI, Kitakyushu-shi (JP)

(72) Inventor: Yasufumi Yoshiura, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 369 days.

(21) Appl. No.: 15/439,945

(22) Filed: Feb. 23, 2017

(65) Prior Publication Data
US 2017/0242076 A1 Aug. 24, 2017

(30) Foreign Application Priority Data
Feb. 23, 2016 (JP) ................................. 2016-031859

(51) Int. Cl.
 *G01R 31/34* (2020.01)
 *G05B 23/02* (2006.01)
 *G05B 19/402* (2006.01)

(52) U.S. Cl.
 CPC ......... *G01R 31/346* (2013.01); *G01R 31/343* (2013.01); *G05B 19/402* (2013.01); *G05B 23/0235* (2013.01); *G05B 2219/34475* (2013.01)

(58) Field of Classification Search
 CPC ................ G01R 31/346; G05B 19/402; G05B 2219/34475
 See application file for complete search history.

(56) References Cited

U.S. PATENT DOCUMENTS

| | | | | |
|---|---|---|---|---|
| 6,064,172 A | * | 5/2000 | Kuznetsov | G01R 31/346 318/434 |
| 9,971,346 B2 | * | 5/2018 | Rikkola | G05B 23/0232 |
| 2005/0199217 A1 | * | 9/2005 | Kamimura | F02D 11/105 123/399 |
| 2007/0052383 A1 | * | 3/2007 | Abe | G05B 19/4062 318/651 |
| 2010/0052581 A1 | * | 3/2010 | Izumi | B60K 6/48 318/400.04 |

(Continued)

FOREIGN PATENT DOCUMENTS

| | | |
|---|---|---|
| JP | H10-248275 A | 9/1998 |
| JP | 2001-159901 | 6/2001 |

(Continued)

OTHER PUBLICATIONS

Japanese Office Action for corresponding JP Application No. 2016-031859, dated Jul. 31, 2018 (w/ machine translation).

(Continued)

*Primary Examiner* — Manuel A Rivera Vargas
*Assistant Examiner* — Yaritza H Perez Bermudez
(74) *Attorney, Agent, or Firm* — Mori & Ward, LLP

(57) ABSTRACT

An abnormality determining apparatus for a motor driven mechanism includes circuitry. The circuitry is configured to acquire time-series data with respect to an input to and an output from a motor which drives the motor driven mechanism, detect data abnormality in the time-series data, and determine, based on the data abnormality, whether mechanical abnormality in the motor driven mechanism occurs.

16 Claims, 24 Drawing Sheets

(56) References Cited

U.S. PATENT DOCUMENTS

| | | | |
|---|---|---|---|
| 2010/0169030 A1* | 7/2010 | Parlos | G01H 1/00 702/58 |
| 2011/0282626 A1* | 11/2011 | Rikkola | G05B 23/0232 702/179 |
| 2013/0013138 A1* | 1/2013 | Lu | B60L 3/0061 701/22 |
| 2014/0077746 A1* | 3/2014 | Sekiguchi | H02P 23/14 318/561 |
| 2014/0088831 A1* | 3/2014 | Hisazumi | B62D 5/0493 701/41 |
| 2014/0172400 A1* | 6/2014 | Majewski | G06F 17/5009 703/18 |
| 2014/0201571 A1* | 7/2014 | Hosek | G06F 11/2257 714/26 |
| 2014/0239867 A1* | 8/2014 | Bessho | H02H 7/0851 318/466 |
| 2015/0169393 A1 | 6/2015 | Shibuya | |
| 2016/0244042 A1* | 8/2016 | Nishikawa | B60T 13/741 |
| 2017/0242076 A1* | 8/2017 | Yoshiura | G01R 31/346 |

FOREIGN PATENT DOCUMENTS

| | | |
|---|---|---|
| JP | 2005-291702 A | 10/2005 |
| JP | 2007-139621 | 6/2007 |
| JP | 2011-090382 | 5/2011 |
| JP | 2012137386 A | 7/2012 |
| JP | 2012-194035 A | 10/2012 |
| JP | 2015-021901 | 2/2015 |
| JP | 2015-114967 | 6/2015 |
| JP | 2015-216709 | 12/2015 |
| JP | 5827425 B2 | 12/2015 |
| JP | 5827426 B2 | 12/2015 |

OTHER PUBLICATIONS

Abe et al., "Proposal of the threshold-value setting-up method in the MT method and comparison", and on Academia, information science and engineering: Nanzan University bulletin, Mar. 2013, vol. 13, pp. 23-33, See Cite No. 8.

Japanese Office Action for corresponding JP Application No. 2016-031859, dated Dec. 20, 2017.

Japanese Office Action for corresponding JP Application No. 2018-151901, dated Oct. 29, 2019 (w/ machine translation).

Japanese Office Action for corresponding JP Application No. 2018-151901, dated Jan. 30, 2020 (w/ machine translation).

* cited by examiner

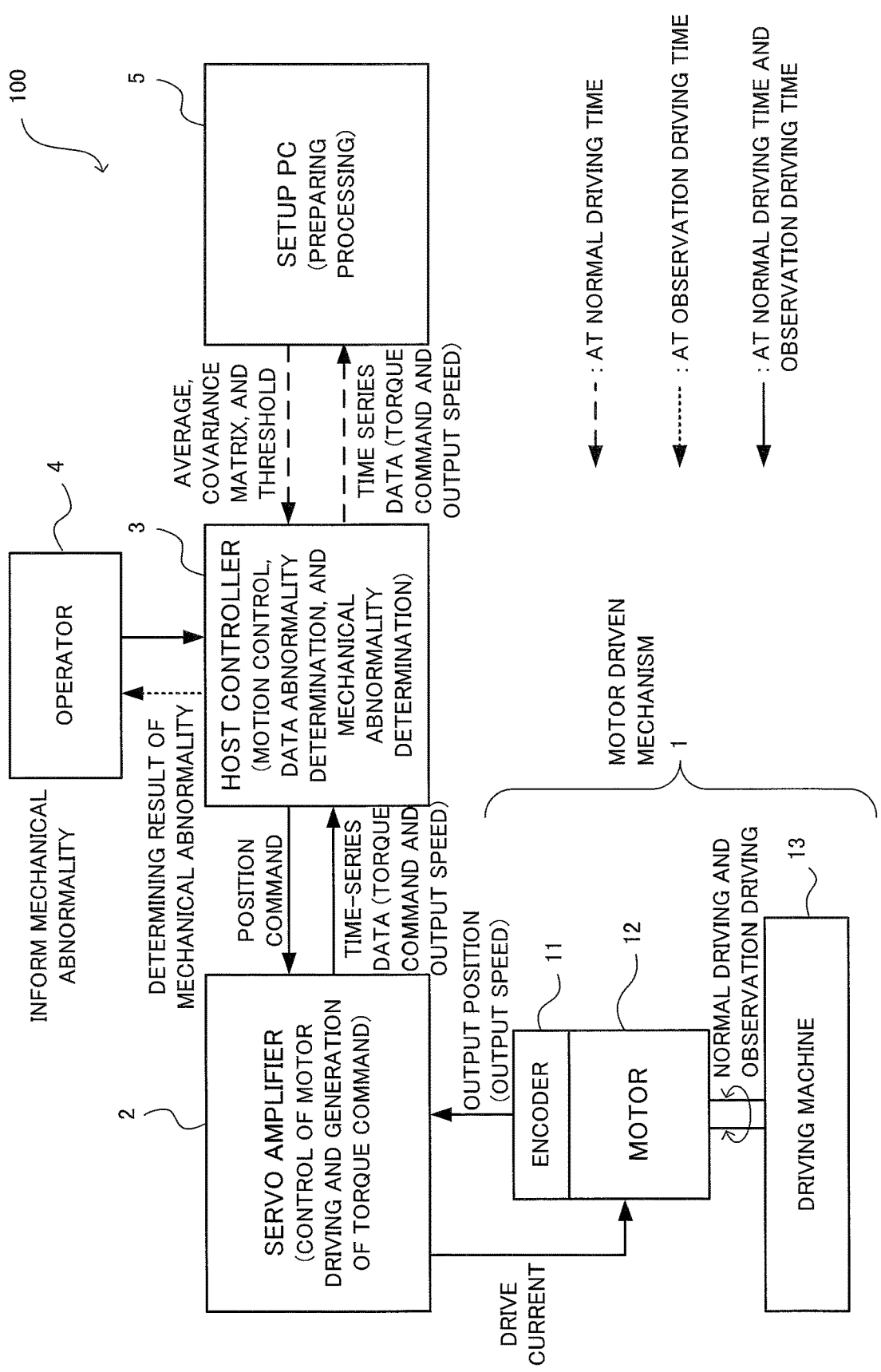
[FIG. 1]

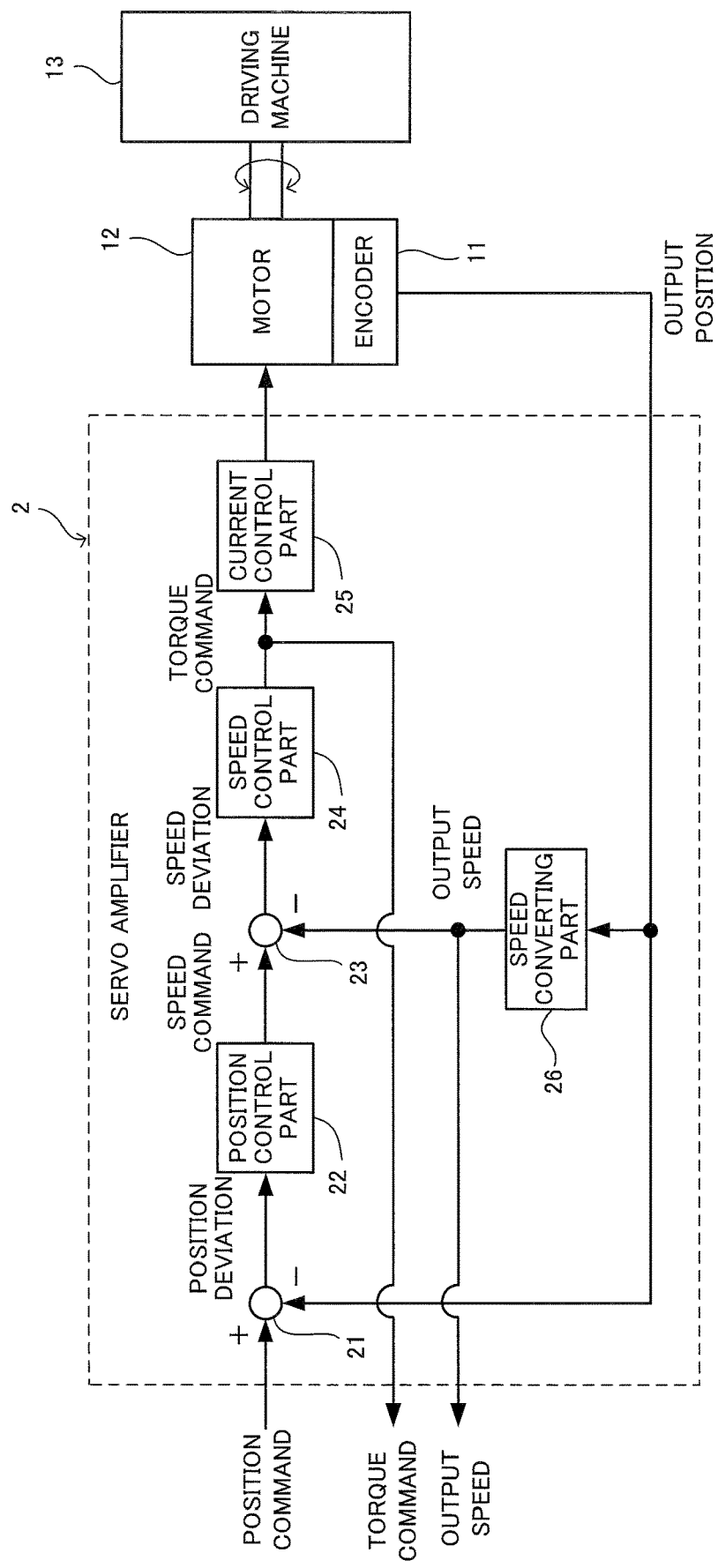
[FIG. 2]

[FIG. 3]

EXAMPLE OF TIME-SERIES DATA (DEGREE M OF FREEDOM = NUMBER OF TYPES OF VARIABLES = 2)

| TIME t [sec] | TORQUE COMMAND 1 [%] | OUTPUT SPEED 1 [$min^{-1}$] | TORQUE COMMAND 2 [%] | OUTPUT SPEED 2 [$min^{-1}$] |
|---|---|---|---|---|
| 0 | 0 | 0 | 0 | 0 |
| 0.001 | 1 | 10 | 1.2 | 9 |
| 0.002 | 3 | 50 | 2.8 | 48 |
| ... | ... | ... | ... | ... |

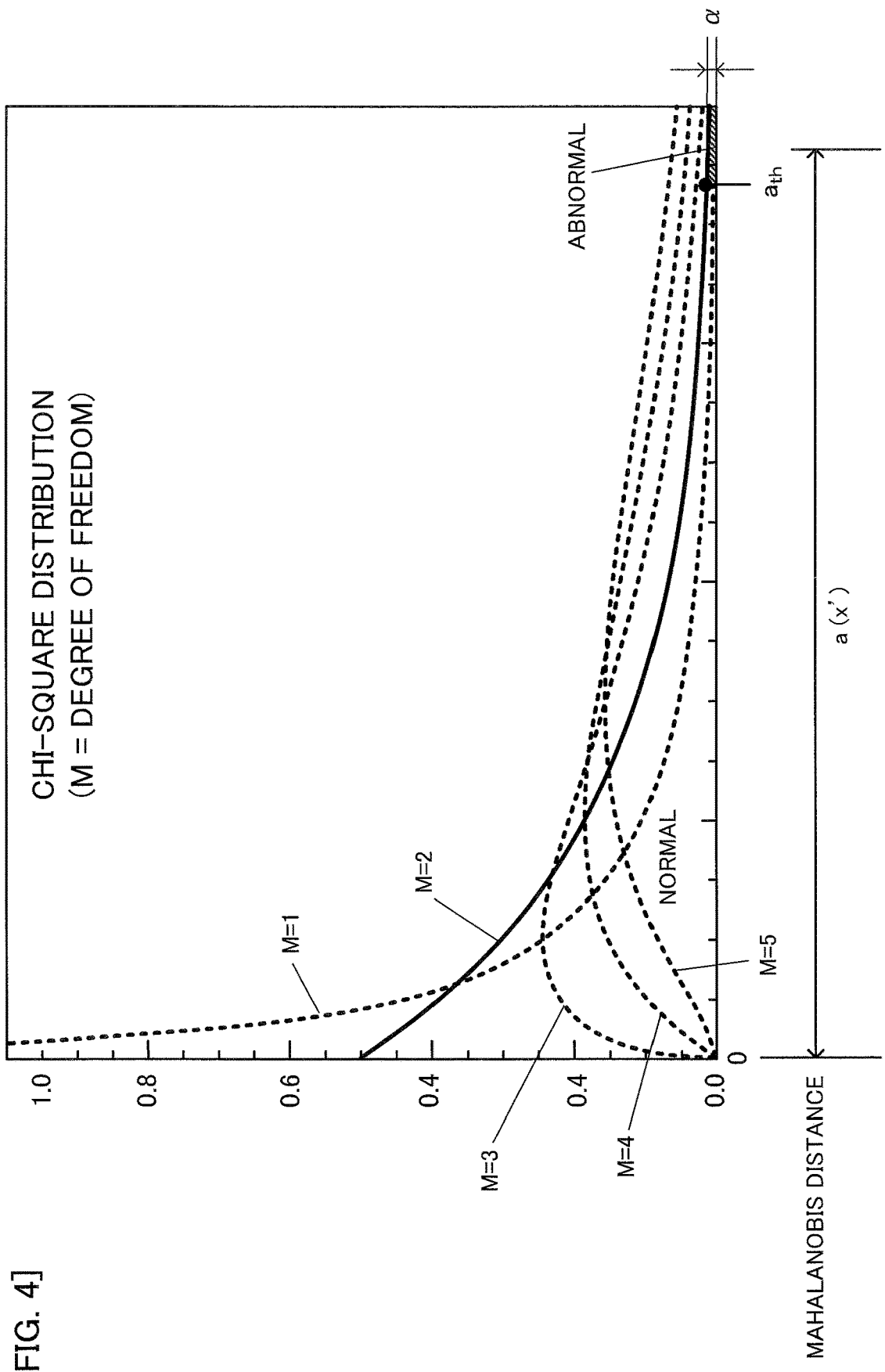
[FIG. 4]

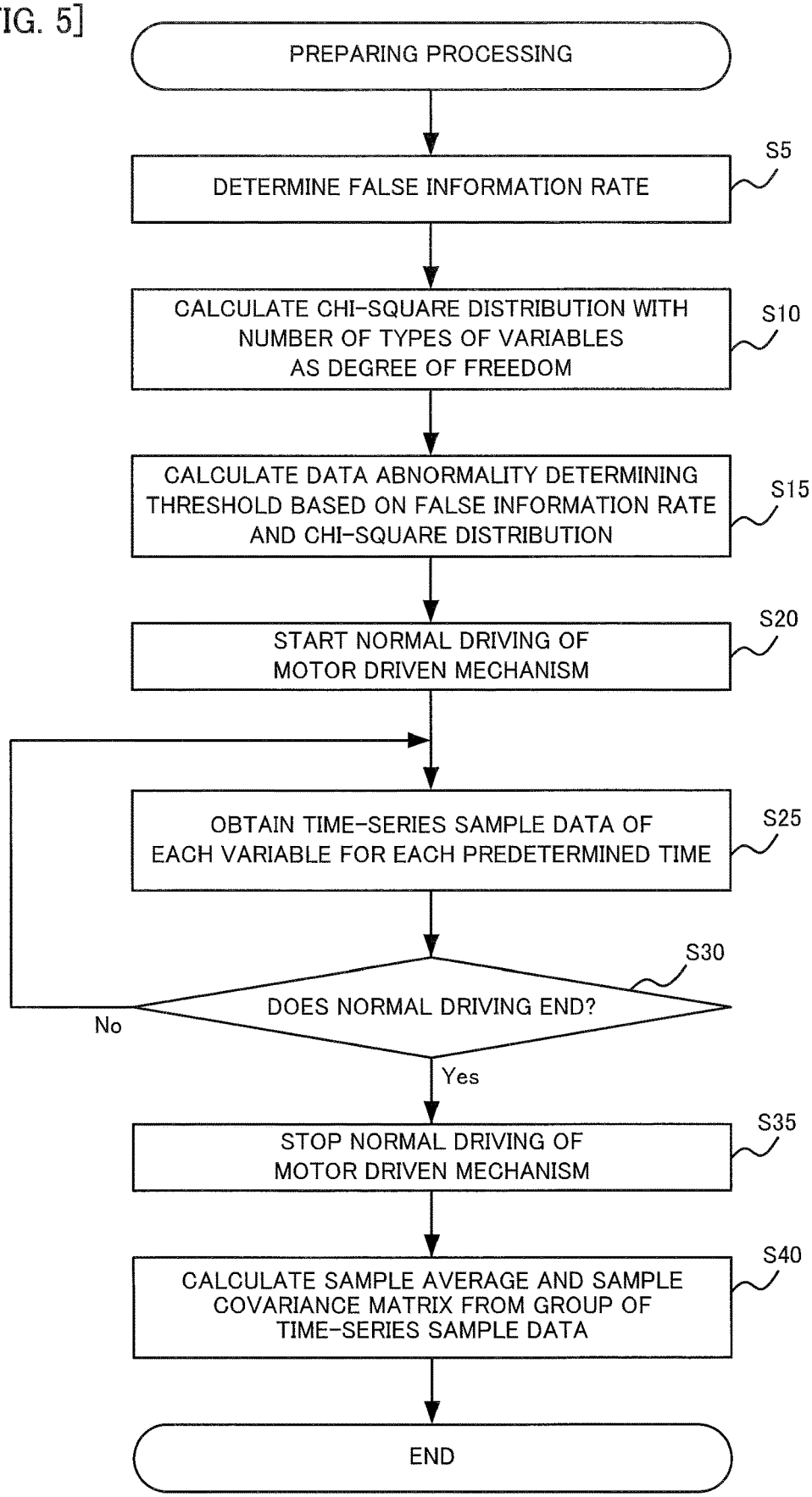
[FIG. 5]

[FIG. 6]
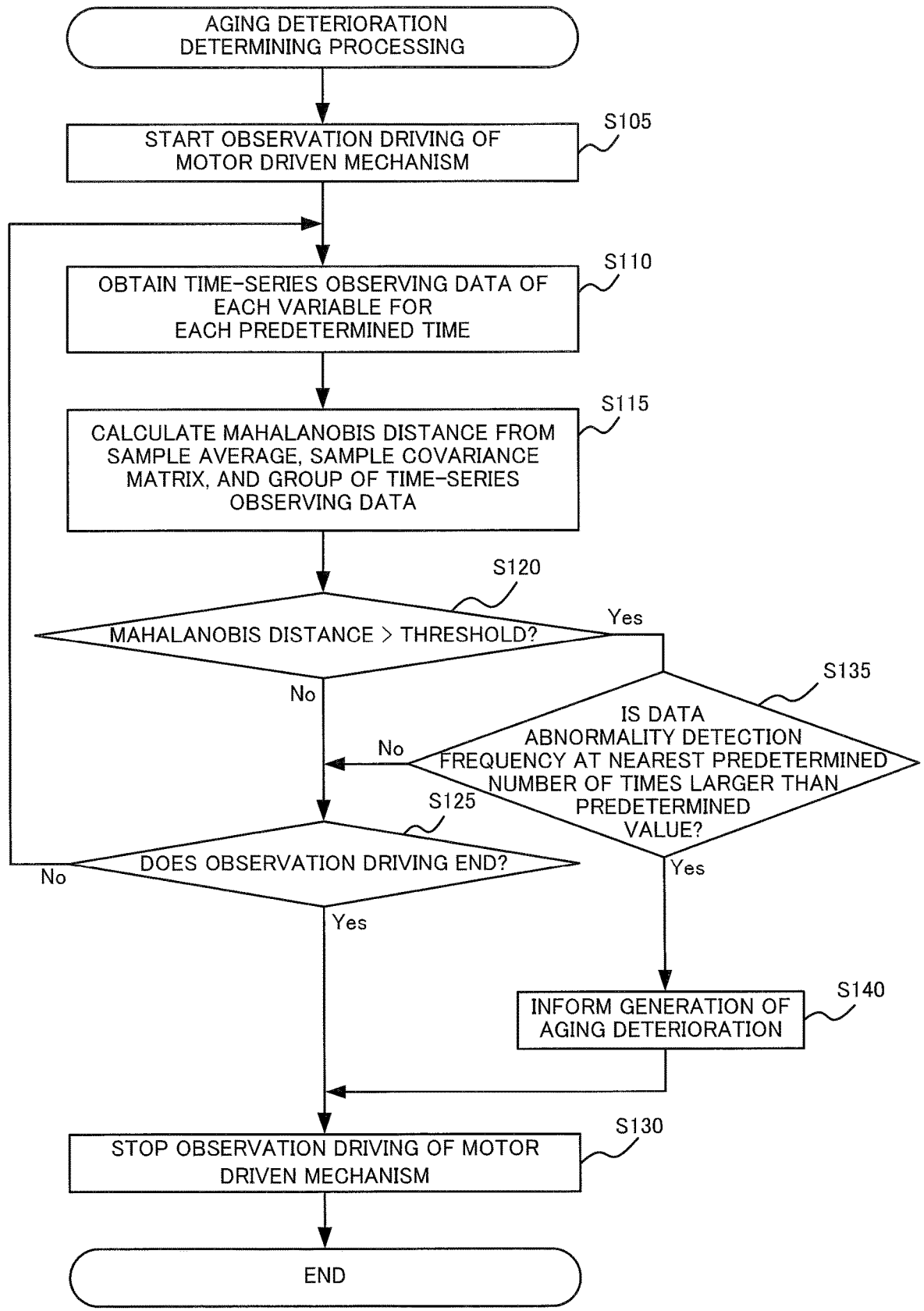

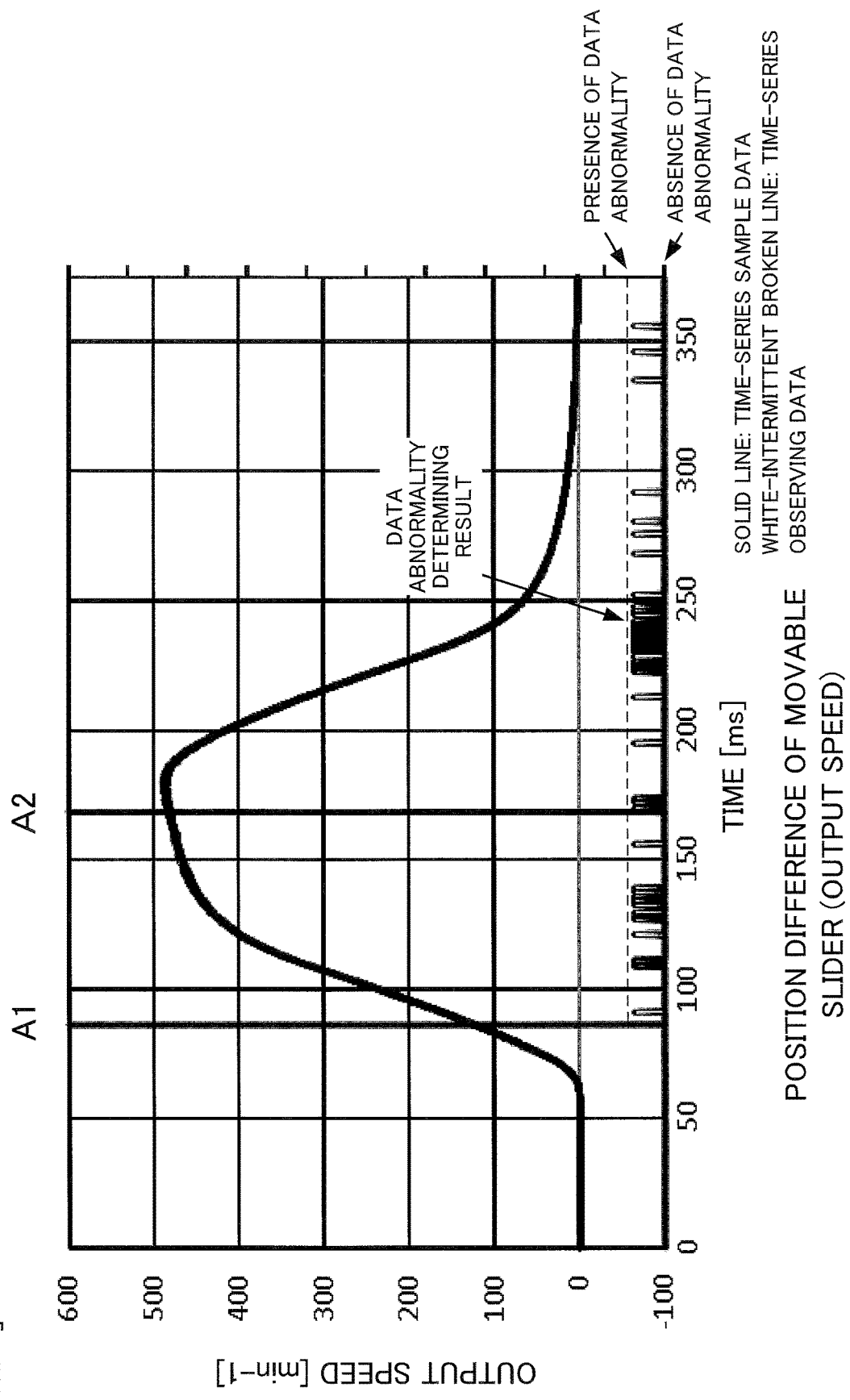

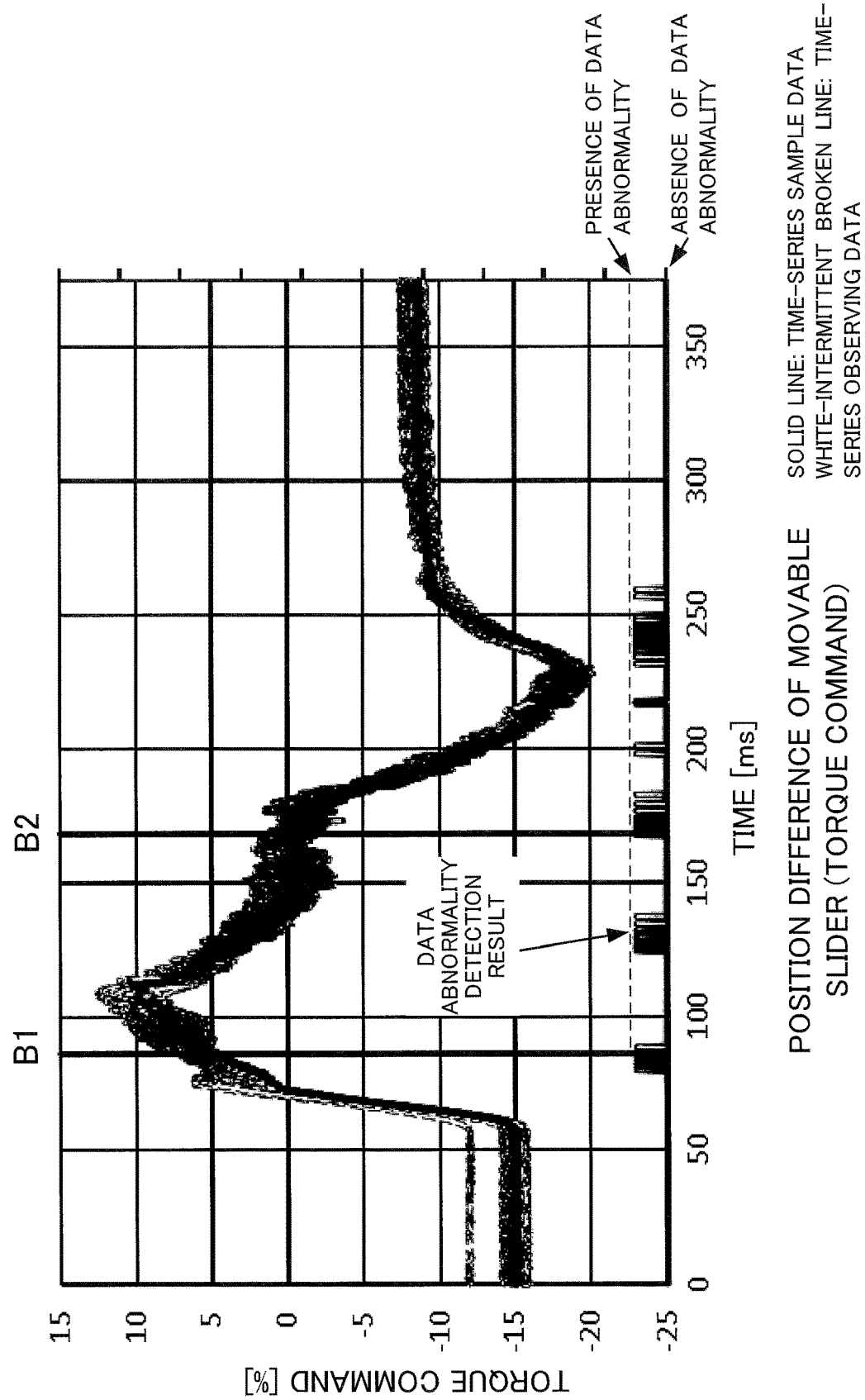
[FIG. 8]

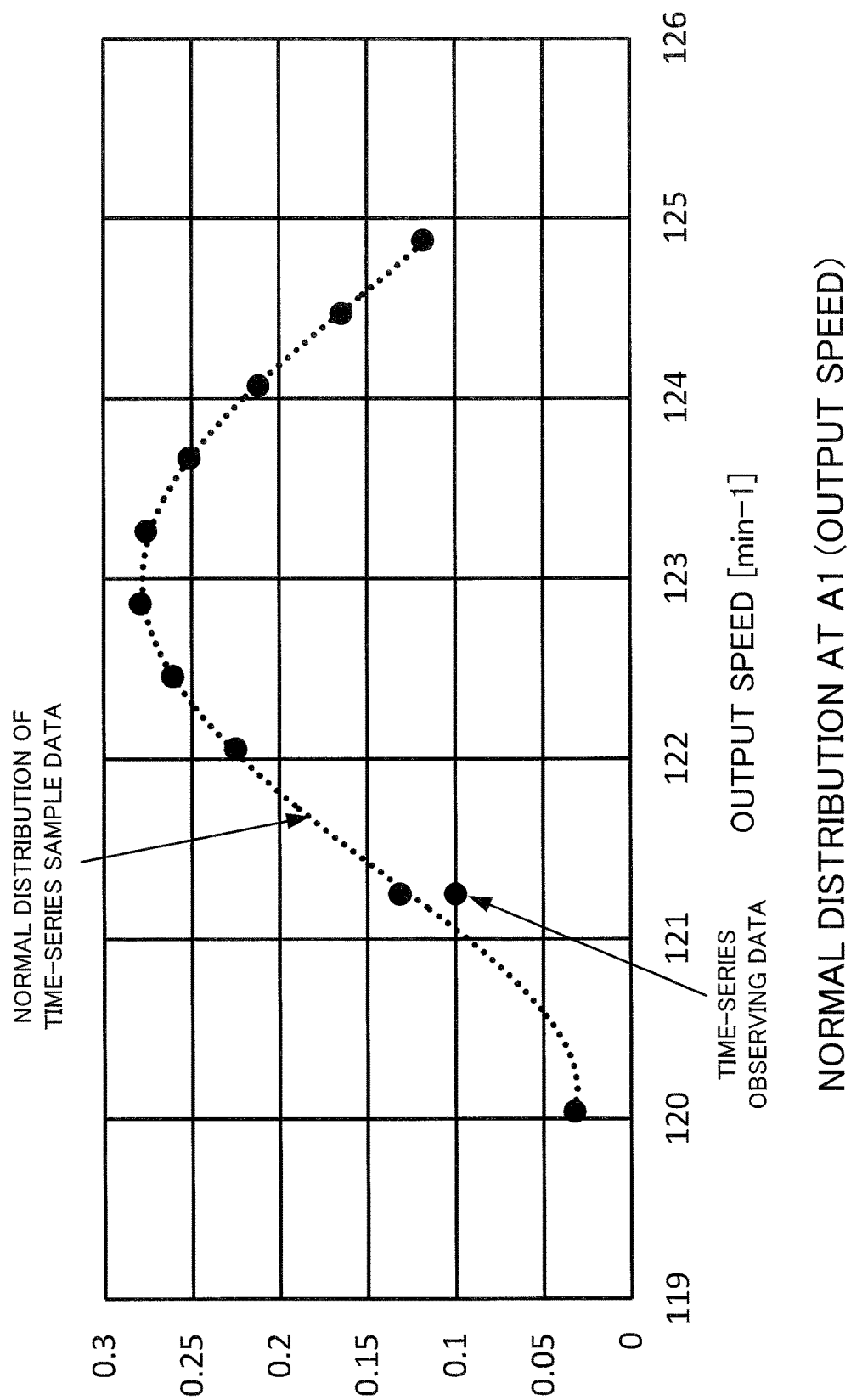
[FIG. 9]

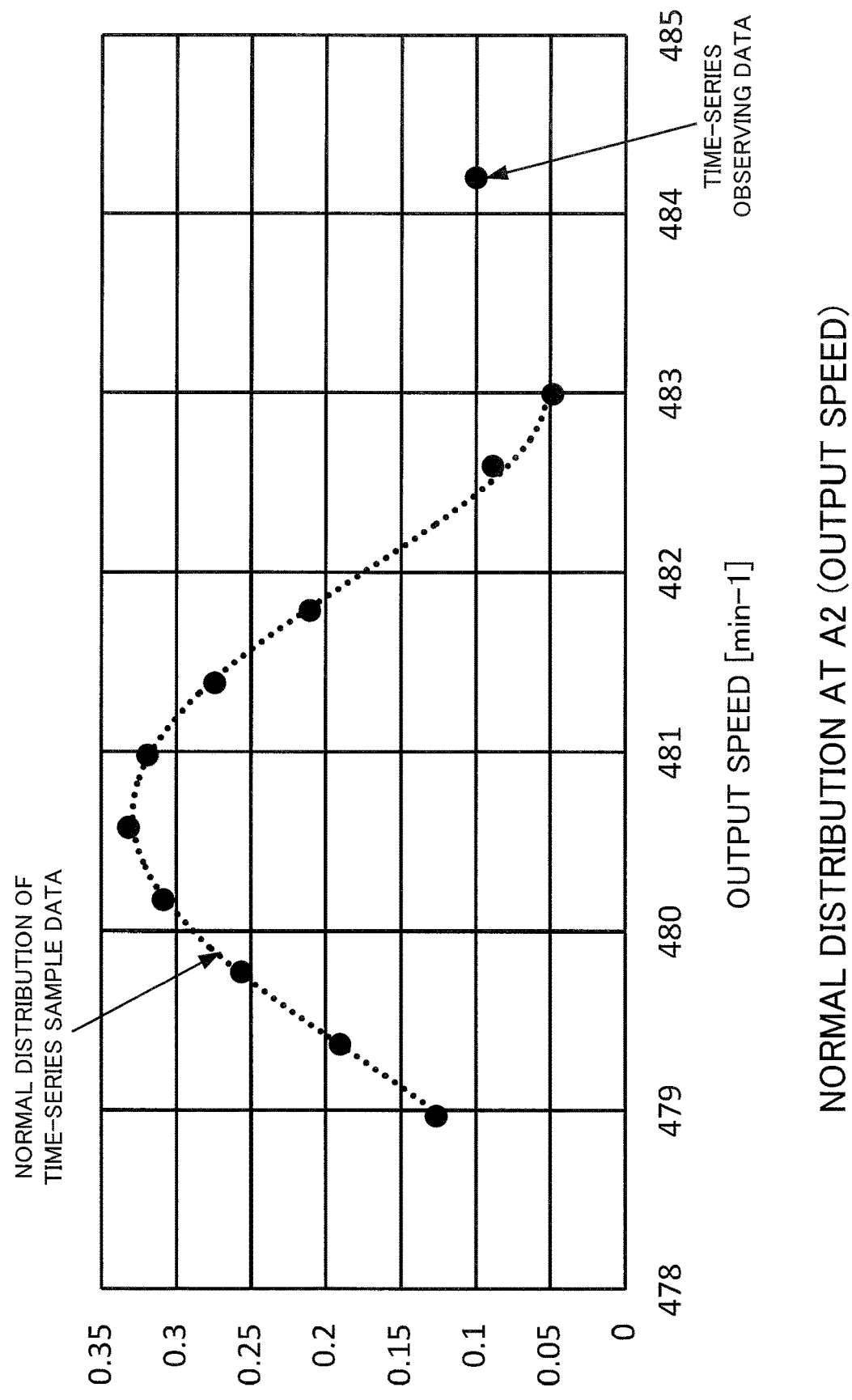
[FIG. 10]

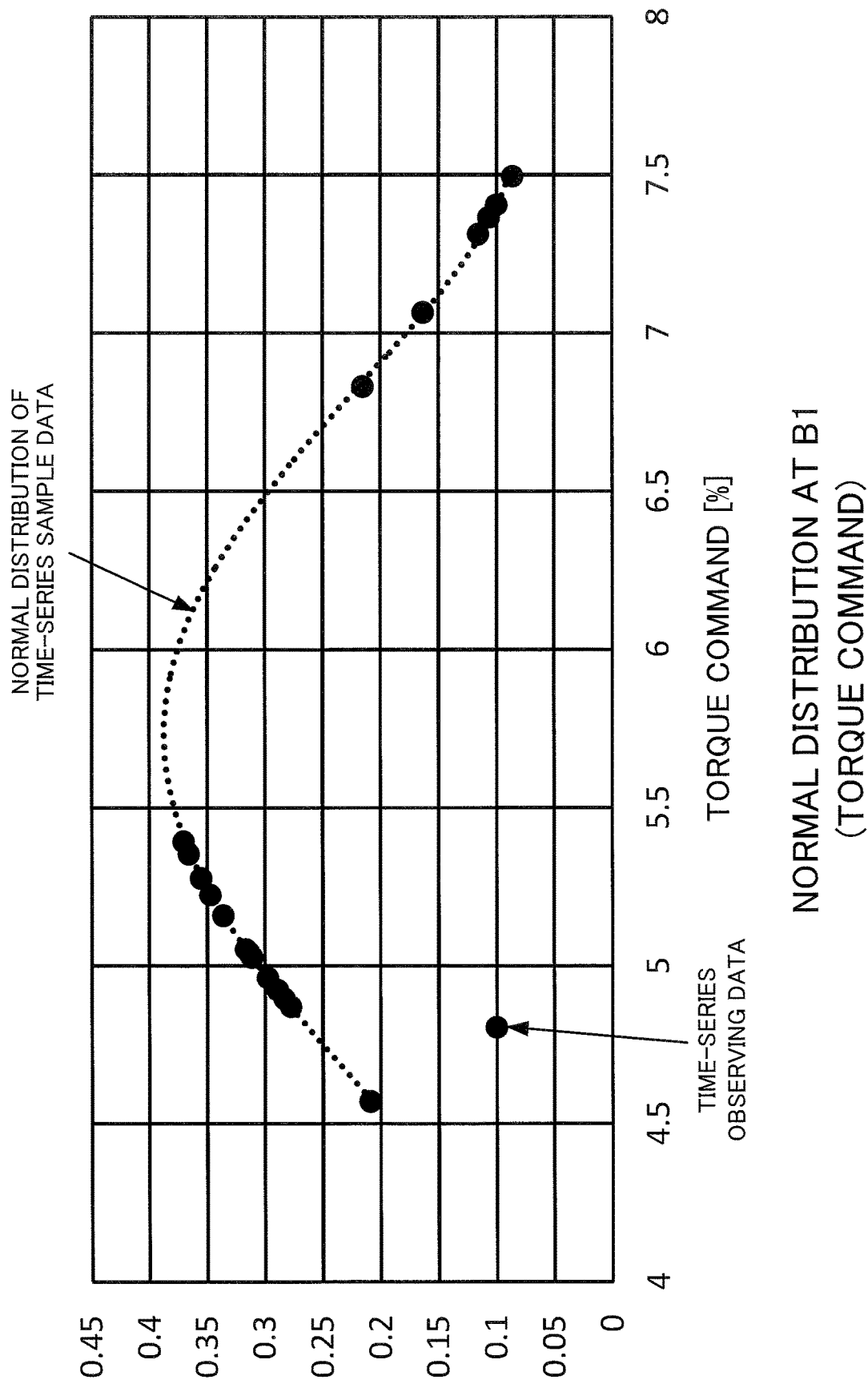
[FIG. 11]

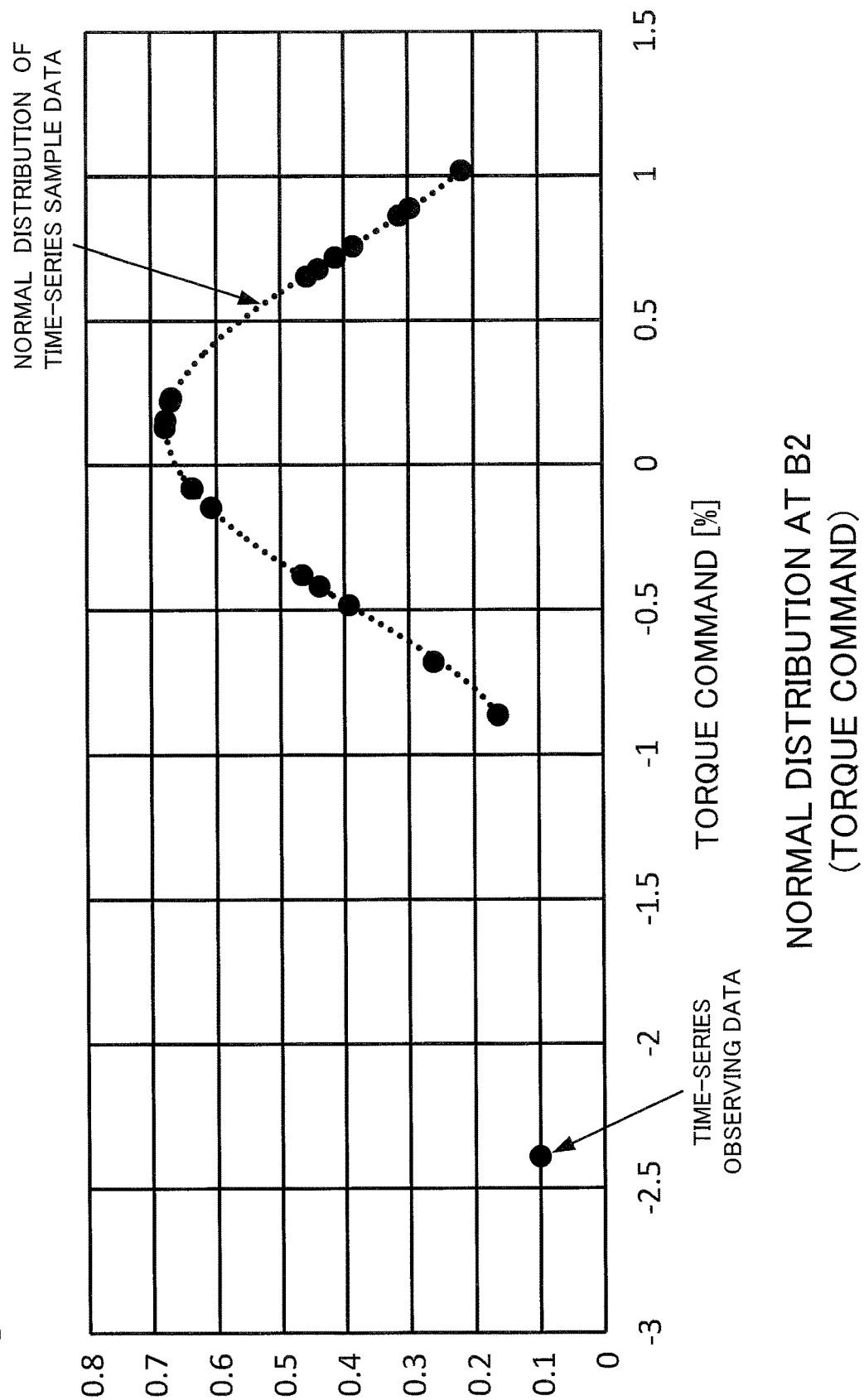
[FIG. 12]

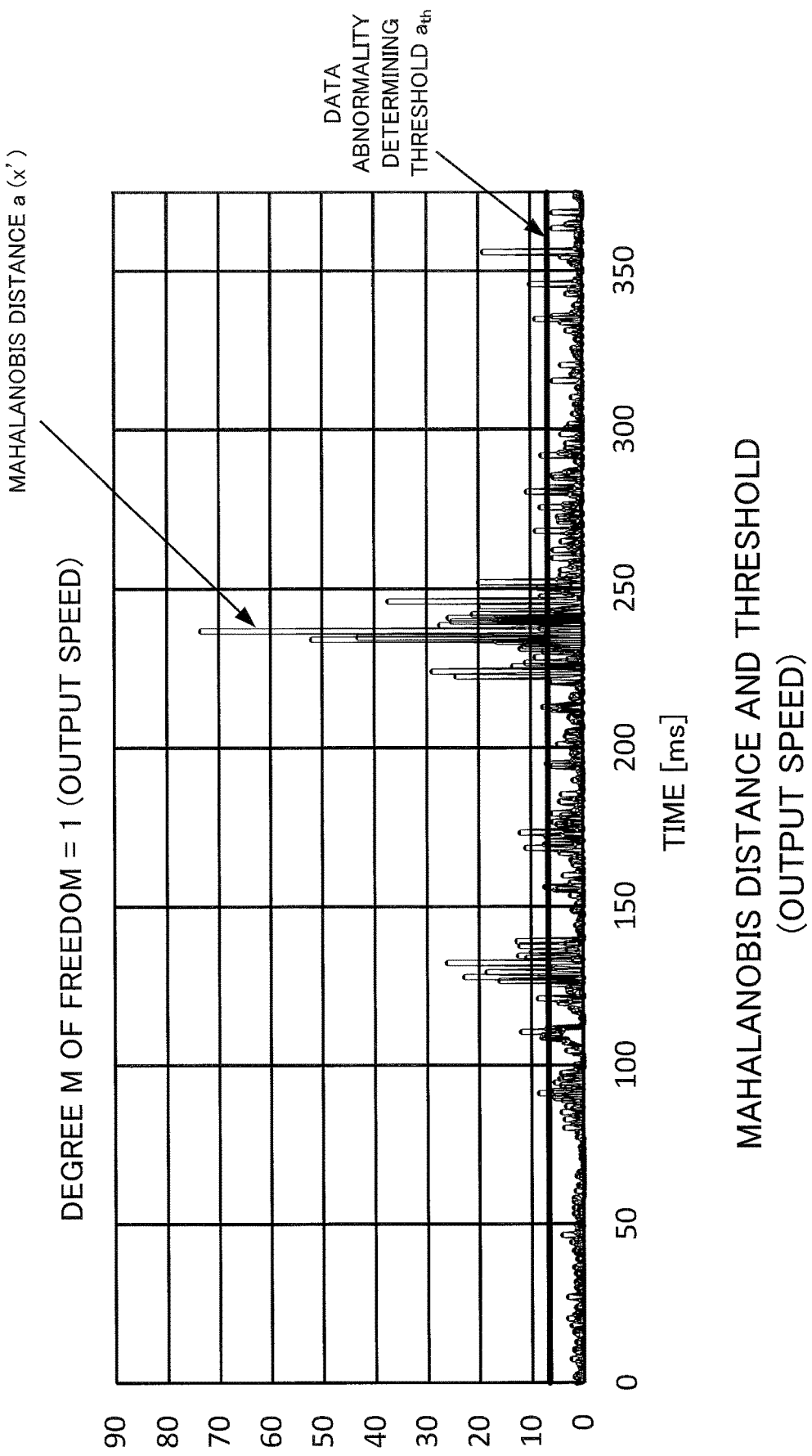

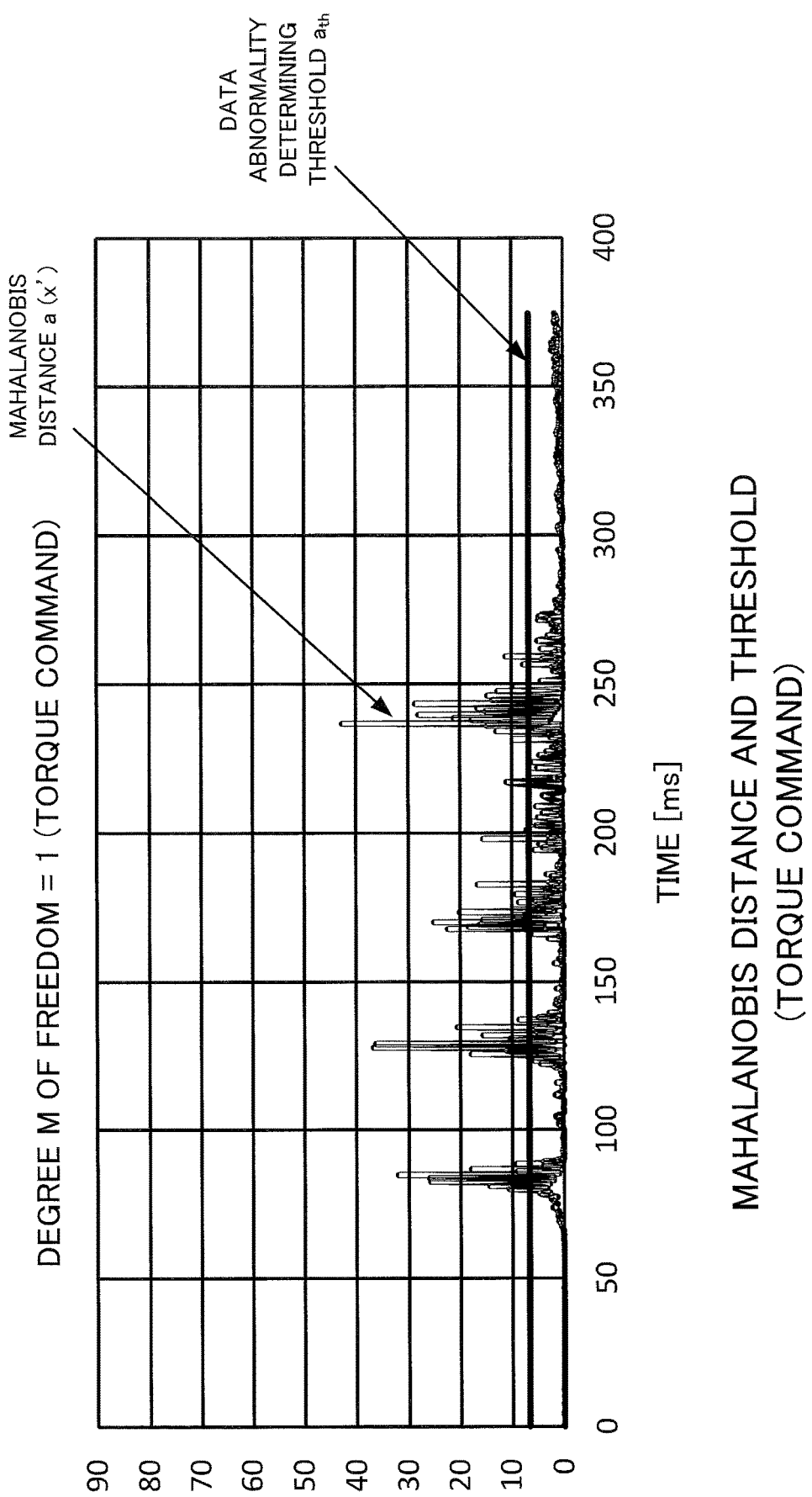

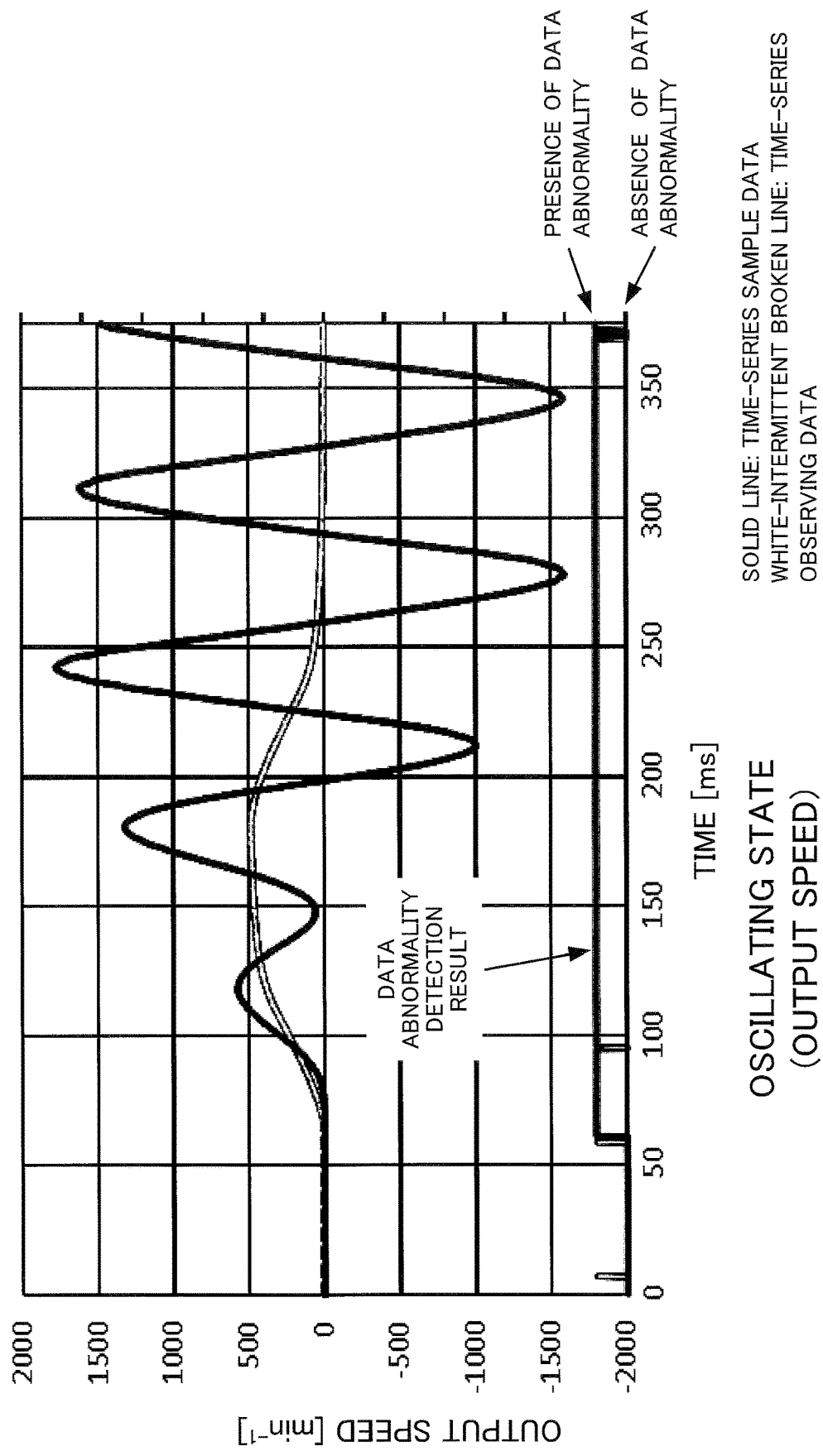
[FIG. 15]

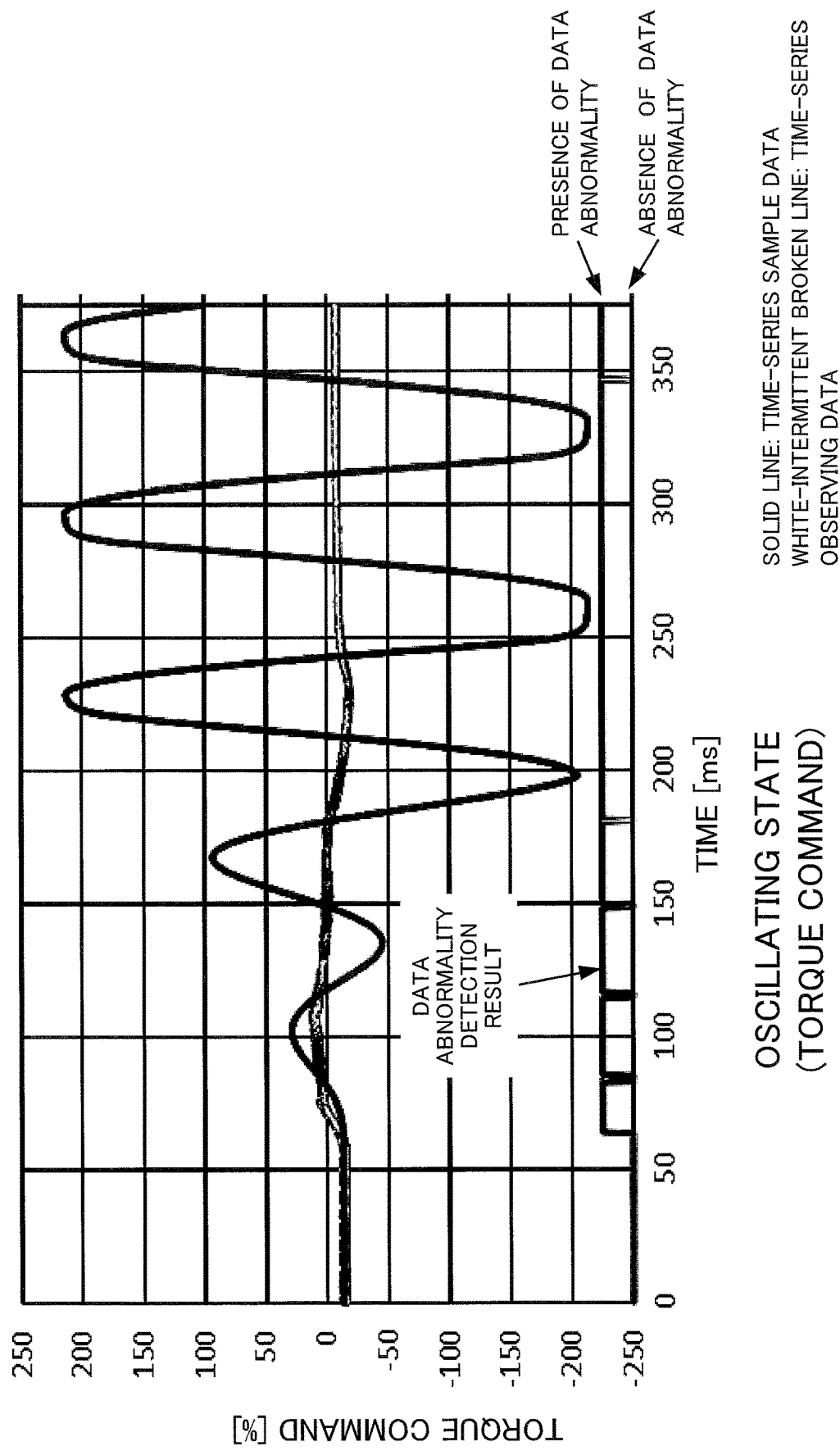
[FIG. 16]

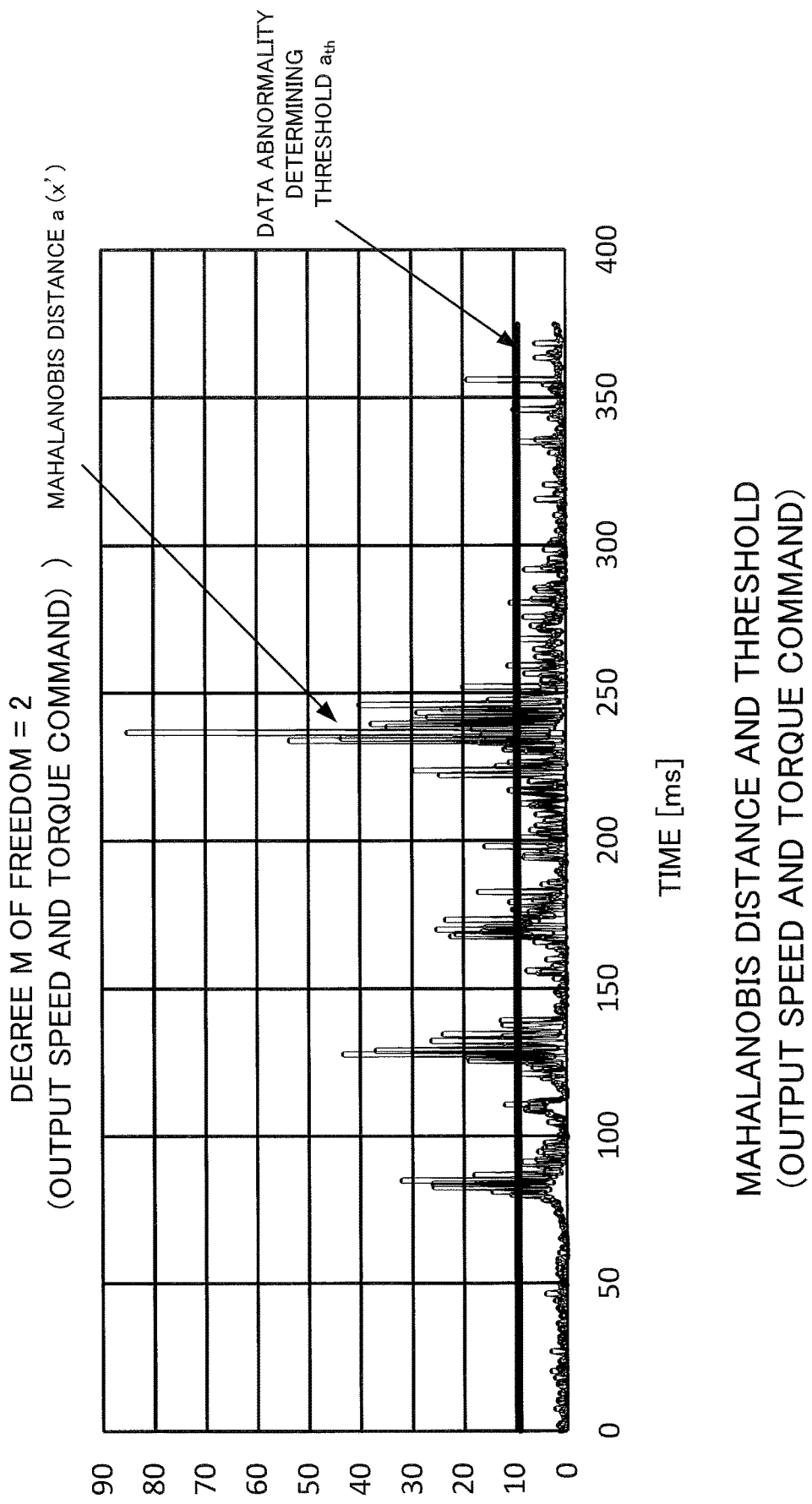
[FIG. 17]

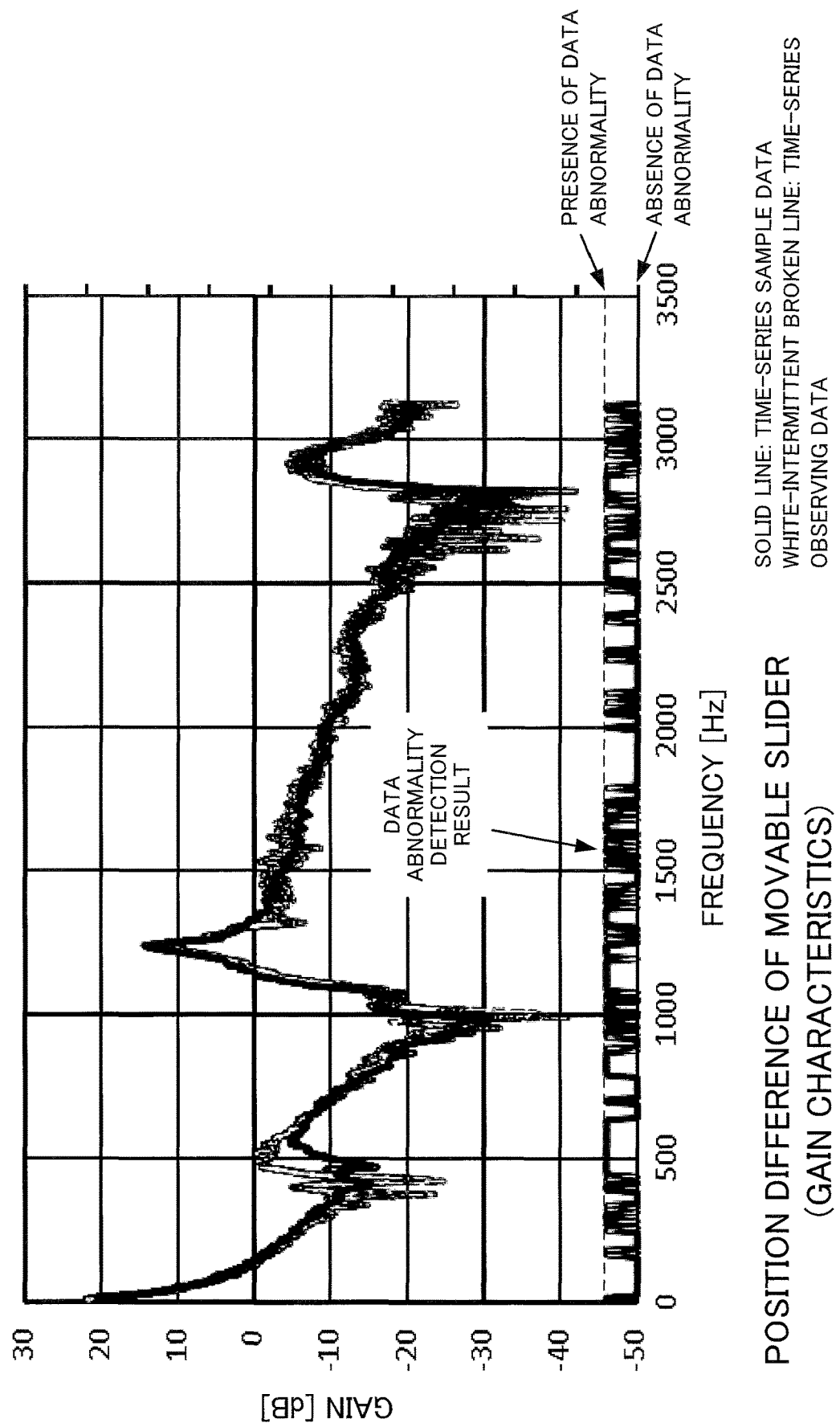

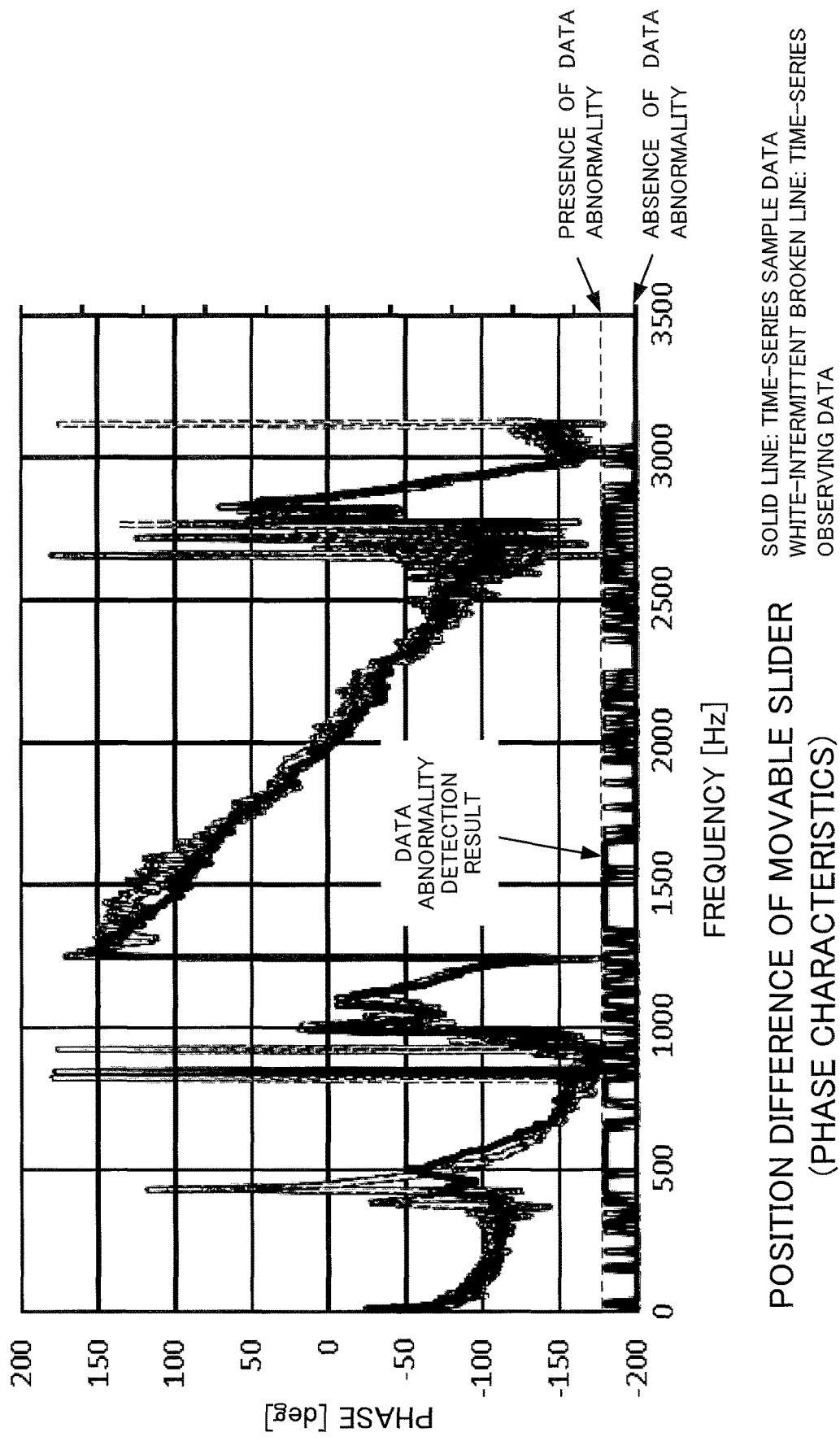
[FIG. 19]

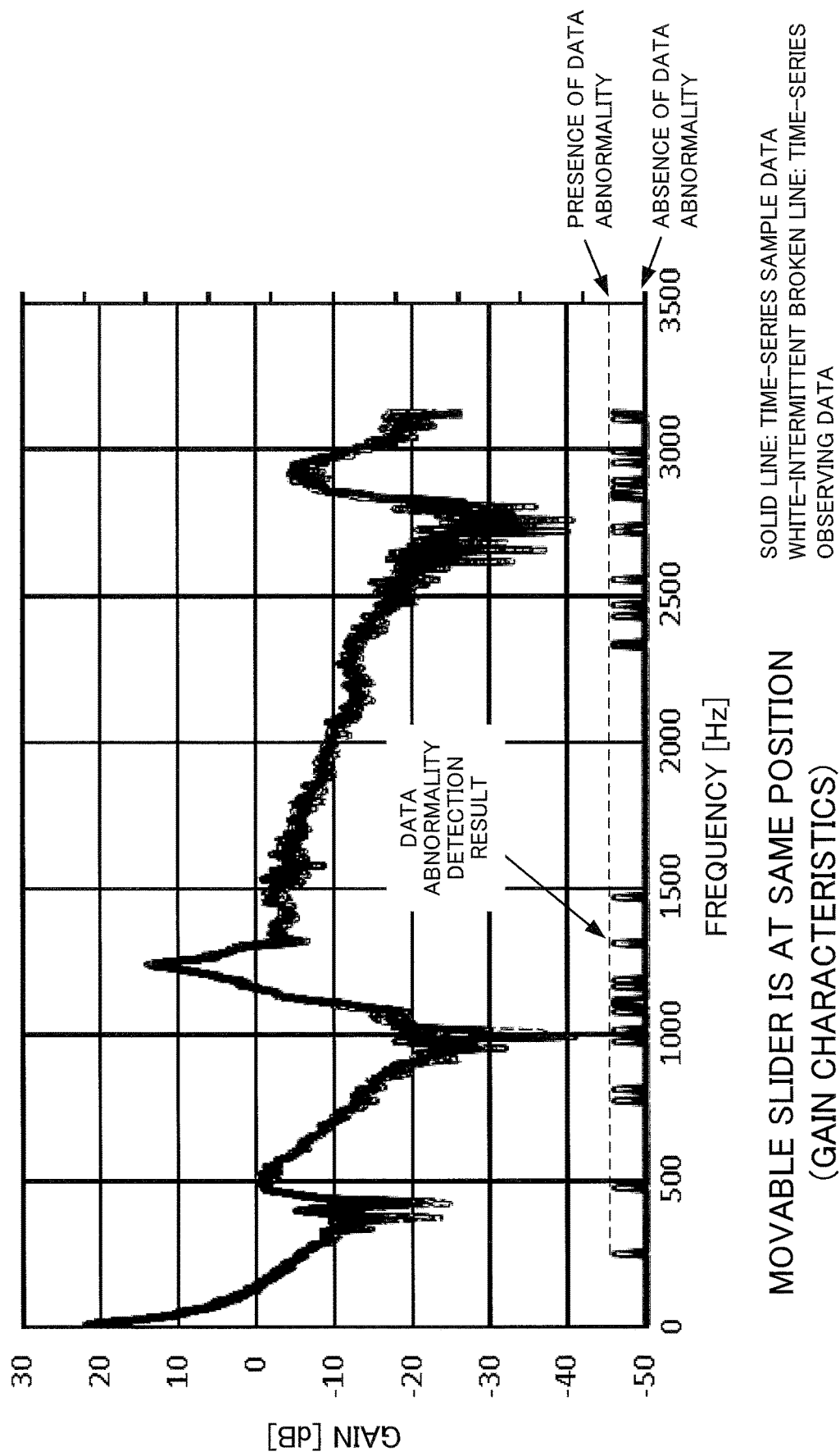
[FIG. 20]

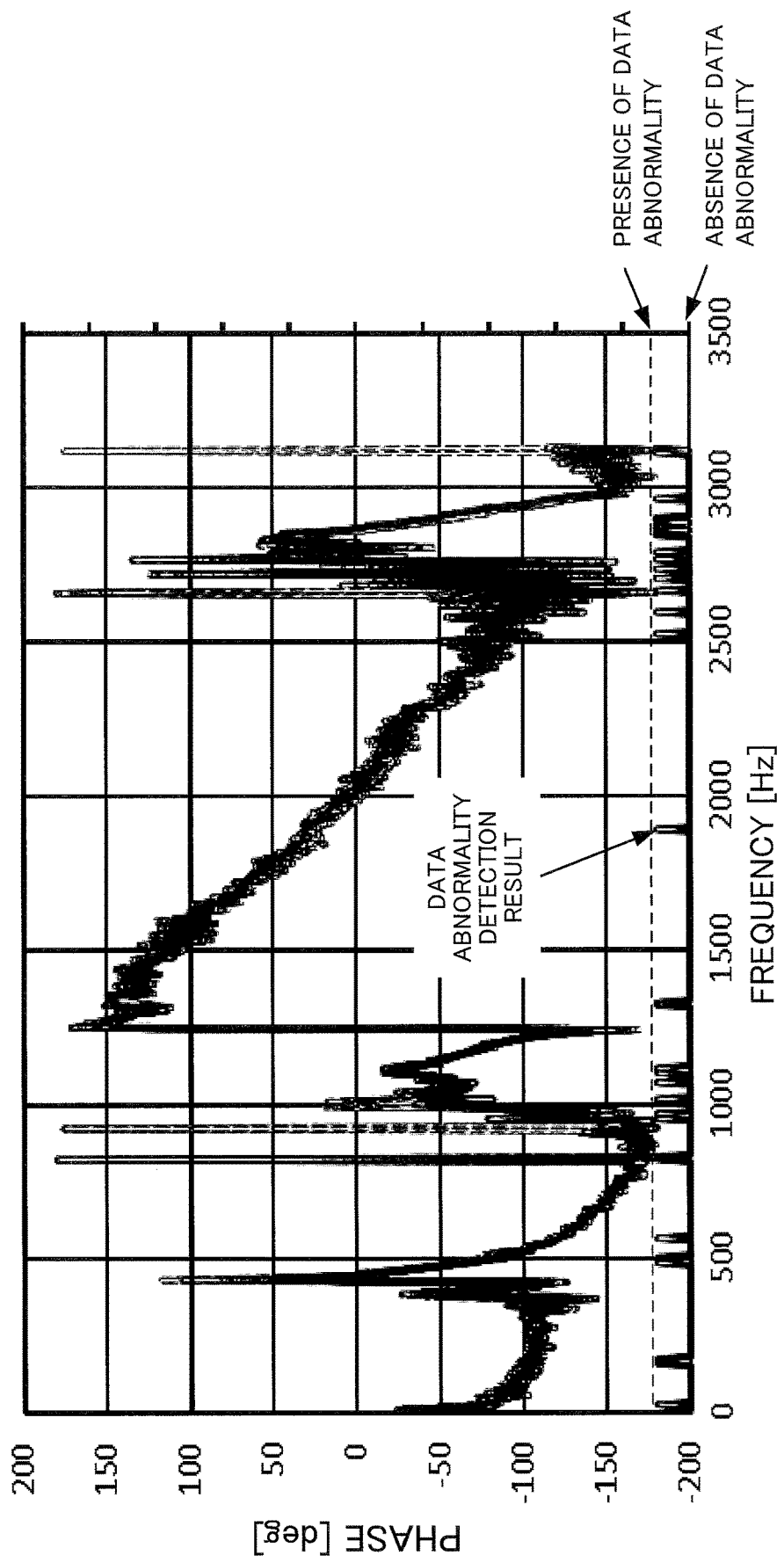

[FIG. 22]

| | SPEED ABNORMALITY | SPEED NORMALITY |
|---|---|---|
| TORQUE ABNORMALITY | OSCILLATION | DISTURBANCE SUPPRESSION (HIGH FRICTION) |
| TORQUE NORMALITY | MECHANICAL OSCILLATION | MECHANICAL NORMALITY |

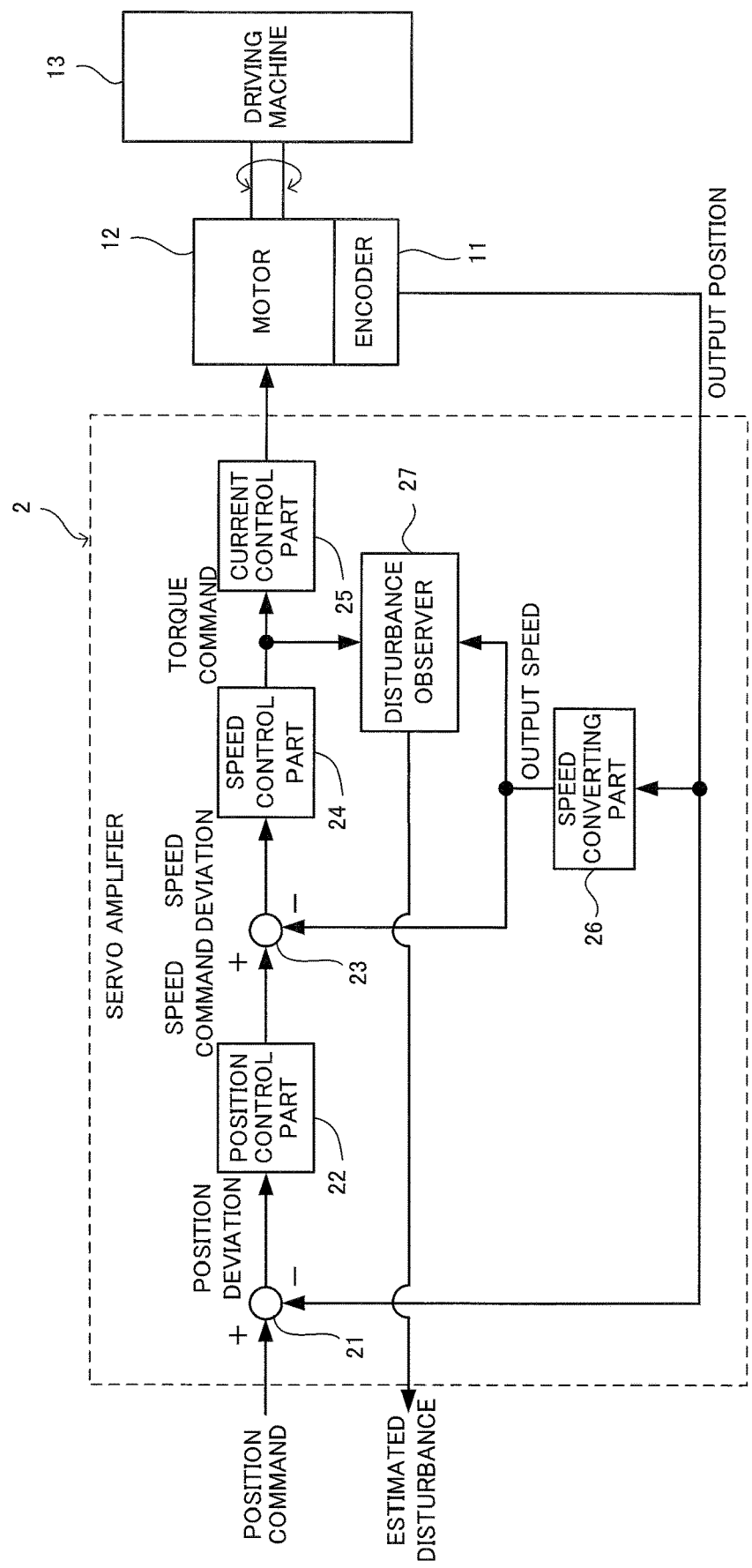
[FIG. 23]

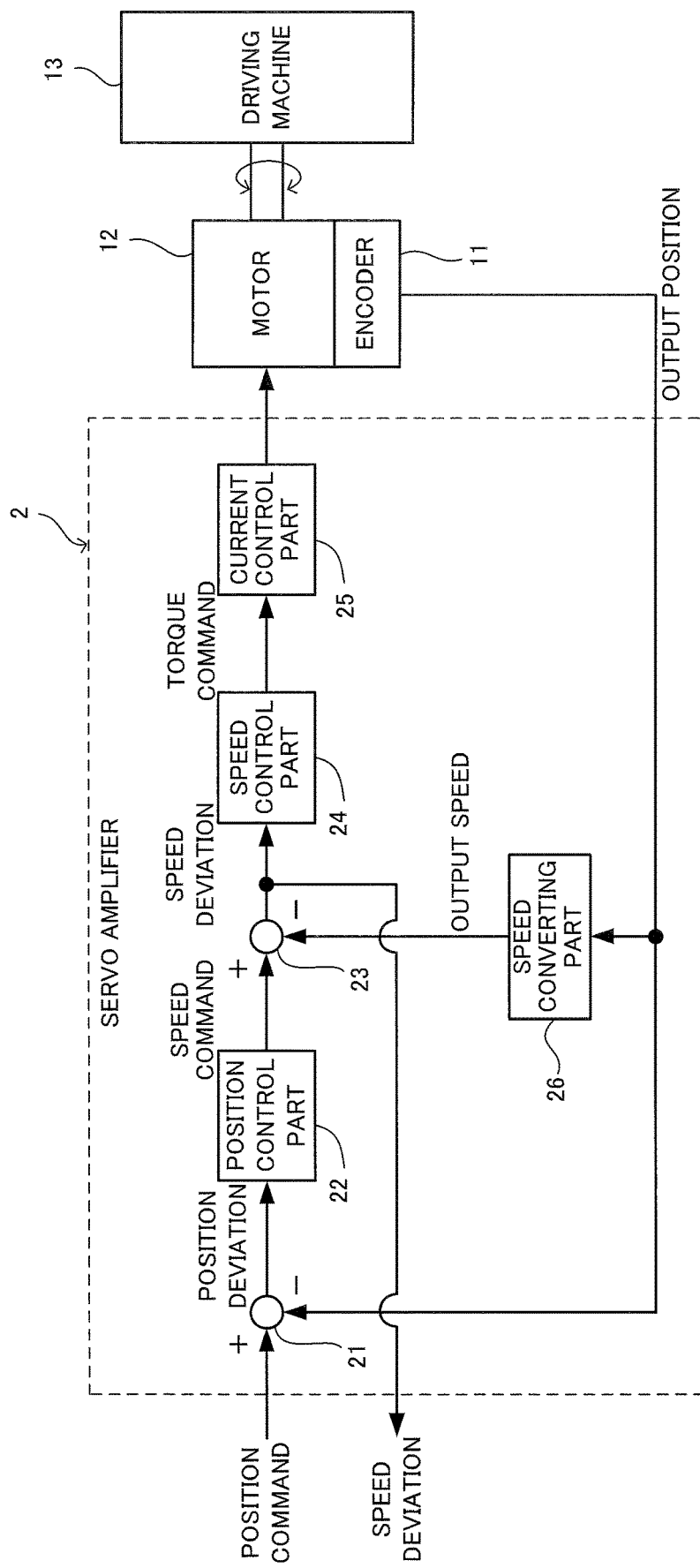
[FIG. 24]

ABNORMALITY DETERMINING APPARATUS, ABNORMALITY DETERMINING METHOD, AND ABNORMALITY DETERMINING SYSTEM

CROSS-REFERENCE TO RELATED APPLICATION

The present application is based upon and claims the benefit of priority to Japanese Patent Application No. 2016-031859, filed Feb. 23, 2016. The entire contents of this application are incorporated herein by reference.

BACKGROUND

Technical Field

The disclosed embodiment relates to an abnormality determining apparatus, an abnormality determining method, and an abnormality determining system.

Description of Background Art

There is known a technology that predicts and diagnoses a state of mechanical equipment by analyzing sensor data based on a statistic method.

SUMMARY

According to one aspect of the present disclosure, an abnormality determining apparatus for a motor driven mechanism includes circuitry. The circuitry is configured to acquire time-series data with respect to an input to and an output from a motor which drives the motor driven mechanism, detect data abnormality in the time-series data, and determine, based on the data abnormality, whether mechanical abnormality in the motor driven mechanism occurs.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 1 is a diagram showing an example of a schematic block configuration of an abnormality determining system;

FIG. 2 is a diagram showing an example of a control block of a servo amplifier that acquires a torque command and an output speed as time-series data in a transfer function format;

FIG. 3 is a table showing an example of time-series data in a case that a degree of freedom is equal to 2;

FIG. 4 is a diagram explaining an example of a relationship among a chi-square distribution, a data abnormality determining threshold, and a Mahalanobis distance;

FIG. 5 is a flowchart showing an example of a control sequence of preparation processing executed by a CPU in a setup PC;

FIG. 6 is a flowchart showing an example of a control sequence of aging deterioration determining processing executed by a CPU in a host controller;

FIG. 7 is a graph plotting examples of time-series sample data, time-series observing data, and a detection result of data abnormality of an output speed in a case that a degree M of freedom is equal to 1 and a movable slide position is different;

FIG. 8 is a graph plotting examples of time-series sample data, time-series observing data, and a detection result of data abnormality of a torque command in a case that the degree M of freedom is equal to 1 and a movable slide position is different;

FIG. 9 is a graph showing examples of a normal distribution of time-series sample data and time-series observing data of an output speed at time A1 in FIG. 7;

FIG. 10 is a graph showing examples of a normal distribution of time-series sample data and time-series observing data of an output speed at time A2 in FIG. 7;

FIG. 11 is a graph showing examples of a normal distribution of time-series sample data and time-series observing data of a torque command at time B1 in FIG. 8;

FIG. 12 is a graph showing examples of a normal distribution of time-series sample data and time-series observing data of a torque command at time B2 in FIG. 8;

FIG. 13 is a graph showing, in a comparison, examples of a Mahalanobis distance and a data abnormality determining threshold of an output speed;

FIG. 14 is a graph showing, in a comparison, examples of a Mahalanobis distance and a data abnormality determining threshold of a torque command;

FIG. 15 is a graph plotting examples of time-series sample data, time-series observing data, and a detection result of data abnormality of an output speed in the case of oscillation;

FIG. 16 is a graph plotting examples of time-series sample data, time-series observing data, and a detection result of data abnormality of a torque command in the case of oscillation;

FIG. 17 is a graph comparing examples of a Mahalanobis distance and a data abnormality determining threshold in a case that the degree M of freedom is equal to 2;

FIG. 18 is a graph plotting with gain characteristics, examples of the time-series sample data and time-series observing data in the case that the degree M of freedom is equal to 1 and a movable slide position is different;

FIG. 19 is a graph plotting with phase characteristics, examples of time-series sample data and time-series observing data in the case that the degree M of freedom is equal to 1 and a movable slide position is different;

FIG. 20 is a graph plotting with gain characteristics, examples of time-series sample data and time-series observing data in the case that the degree M of freedom is equal to 1 and a movable slide position is the same;

FIG. 21 is a graph plotting with phase characteristics, examples of time-series sample data and time-series observing data in the case that the degree M of freedom is equal to 1 and a movable slide position is the same;

FIG. 22 is a table showing an example of a type of mechanical abnormality due to combination of data normality and data abnormality of a torque command and an output position;

FIG. 23 is a diagram showing an example of a control block of a servo amplifier for acquiring an output of a disturbance observer as time-series data in a transfer function format;

FIG. 24 is a diagram showing an example of a control block of a servo amplifier for acquiring a speed deviation as time-series data in a transfer function format.

DETAILED DESCRIPTION OF THE EMBODIMENTS

Hereinbelow, a description will be given of an embodiment with reference to drawings.

<1: Whole Configuration of Abnormality Determining System>

A description will be given of an example of the whole configuration of an abnormality determining system according to the present embodiment with reference to FIG. 1.

FIG. 1 shows a schematic block configuration of an abnormality determining system. As shown in FIG. 1, an abnormality determining system 100 includes a motor driven mechanism 1, a servo amplifier 2, a host controller 3, an operator 4, and a setup PC 5.

The driving of the motor driven mechanism 1 is controlled by the abnormality determining system 100, and the motor driven mechanism 1 is a mechanical system for which various abnormalities of the driving are determined. The motor driven mechanism 1 includes a motor 12 having an encoder 11 and a driving machine 13 driven by the motor 12. According to the present embodiment, the motor 12 is a rotary-type electrical motor, and the encoder 11 is a sensor that optically detects and outputs a rotational position of the motor.

The servo amplifier 2 has a function (motor driving control function) that supplies drive current to the motor 12 and drive-controls the motor 12 to follow an output position of the motor 12 to a position command input from the host controller 3, which will be described later. Further, the servo amplifier 2 also has a function for sequentially acquiring, as time-series data, two pieces of data of a torque command generated in a process for feeding drive current and an output speed generated based on an output position of the motor 12 output from the encoder 11, and outputting the data to the host controller 3 (refer to FIG. 2, which will be described later).

The host controller 3 has a function (motion control function) for sequentially outputting the position command of the motor 12 to allow the driving machine 13 to perform a desired temporal driving operation. Further, the host controller 3 has a function for storing the time-series data input from the servo amplifier 2, detecting data abnormality based on the time-series data and determining mechanical abnormality based on a detection aspect of the data abnormality determination, at a time of observation drive, which will be described later. Further, at a time of normal driving, which will be described later, the host controller 3 outputs the time-series data input from the servo amplifier 2 as it is to the setup PC 5 which will be described later.

The operator 4 includes a display part and an operating part not shown in particular and has a function as a user interface for displaying various pieces of information received and sent from/to the host controller 3, and performing various commands and parameter inputs. Note that, at the time of observation drive, which will be described later, a result of determination of the mechanical abnormality input from the host controller 3 is displayed.

The setup PC 5 includes a notebook-type general personal computer, for example, and has a function for performing various initial settings before general operation on the host controller 3. Further, the setup PC 5 performs preparation processing for calculating a sample average, a sample covariance matrix, and a data abnormality determining threshold required for the host controller 3 to detect the data abnormality, based on the time-series data input from the host controller 3 at the time of normal driving, which will be described later, as one of the setting functions, and outputting the calculated values to the host controller 3 (refer to FIG. 5, which will be described later). Note that, at the general operation time (that is, at the time of observation drive, which will be described later), the setup PC 5 is not required without any processing. Therefore, the setup PC 5 can be detached from the host controller 3.

Note that, in the above, the servo amplifier 2, the host controller 3, the operator 4, and the setup PC 5 correspond to an embodiment of the abnormality determining apparatus.

<2: Control Block of Servo Amplifier>

FIG. 2 shows an example of the control block of the servo amplifier 2 in a transfer function format. Note that the control block shown in FIG. 2 is realized by software executed by a CPU (not shown in particular) included in the servo amplifier 2. However, a part or all of the control block may be implemented by ASIC, FPGA, or an actual device such as another electrical circuit.

In FIG. 2, the servo amplifier 2 includes a subtractor 21, a position control part 22, a subtractor 23, a speed control part 24, a current control part 25, and a speed converting part 26. The subtractor 21 subtracts an output position (feedback position) which will be described later, from a position command input from the host controller 3, and outputs a positional deviation. The position control part 22 outputs a speed command by so-called PID control based on the positional deviation. The subtractor 23 subtracts an output speed (feedback speed), which will be described later, from the speed command, and outputs a speed deviation. The speed control part 24 outputs the torque command by the so-called PID control based on the speed deviation.

The current control part 25 outputs drive current by power conversion based on the torque command, and feeds the power to the motor 12. The output position when the motor 12 drives the driving machine 13 is detected by the encoder 11, and is fed back to the servo amplifier 2. The output position is subtracted from the position command in the subtractor 21, and is input to the speed converting part 26. The speed converting part 26 outputs an output speed as a driving speed of the motor 12 based on the output position. Note that the speed converting part 26 may include a differentiator and the like that time-differentiates the output position.

The subtractor 21, the position control part 22, the subtractor 23, the speed control part 24, the current control part 25, and the speed converting part 26 as described above form a double-feedback loop of a so-called position control feedback loop and a speed control feedback loop together with the external motor 12 and the encoder 11. Note that the current control part 25 includes a current control feedback loop therein that is omitted in the diagram. In the feedback loops, the output of the position deviation by the subtractor 21 is the same as the time differentiation processing of the position command, and the output of the speed deviation by the subtractor 23 is the same as the time differentiation processing of the speed command. Therefore, it is considered that in the double-feedback loop provided for the servo amplifier 2, the feedback control is performed based on a motion equation of $$F = kr + \mu \dot{x} + m\ddot{x}$$

(k: spring coefficient, μ: friction coefficient, m: moment of inertia of movable part).

The servo amplifier 2 sequentially detects the torque command and the output speed as time-series data for a short period such as a system cycle, and outputs the data to the host controller 3.

<3: Detection of Data Abnormality>

In recent years, preventive maintenance is becoming a keyword as a part of improvement of an additional value to a mechanical system. Such a configuration has been adopted that presents information as a support of the preventive maintenance to the host controller 3 by a life-time monitor, an installation environment monitor, or the like. However, in addition thereto, it is requested to detect a mechanical abnormality such as secular change or oscillation of the motor driven mechanism 1. The abnormality determining system 100 according to the present embodiment detects the mechanical abnormality of the motor driven mechanism 1 in response to the request.

A state amount detectable by the servo amplifier 2 is a torque input to the motor 12 or a speed or a position output by the motor 12. In particular, the torque reflects the influence of reactive force on the driving machine 13 side in the case of the position/speed control. Therefore, it is considered to be possible to grasp the mechanical abnormality such as secular change by continuous observation. The present embodiment utilizes machine learning based on a statistic method, as a method for detecting the change from the observed waveforms.

However, the abnormality detected by the machine learning as described above is only an abnormal state that can be directly determined from data acquired instantaneously. On the other hand, in the mechanical system such as the motor driven mechanism 1, the position of the mechanism is changed for a very short time, and an abnormal portion and a normal portion of the mechanism are generated at a continuous fine displacement depending on conditions. Therefore, preferably, the mechanical abnormality such as the secular change is determined at all places. Further, in consideration of the entire mechanical system, it is not proper to simply determine the abnormality of the entire mechanical system only with a statistic method.

With the abnormality determining system 100 according to the present embodiment, an abnormal state that is directly determined from data by the machine learning is determined as data abnormality, and an abnormal state corresponding to the secular change or oscillation state in the motor driven mechanism 1 as described above separately is determined as mechanical abnormality. The data abnormality and the mechanical abnormality are separately handled. The abnormality determining system 100 acquires the time-series data on an input and an output of the motor 12 during driving of the motor driven mechanism 1, and the data abnormality is detected in the time-series data. In addition, the abnormality determining system 100 determines the mechanical abnormality of the motor driven mechanism 1 based on an acquisition aspect (acquisition time, acquisition frequency, frequency of acquisition, acquisition combination, etc.) of the time-series data determined as the data abnormality. Hereinbelow, a description will be sequentially given of respective determining methods of the data abnormality and the mechanical abnormality.

<3-1: Data Abnormality Determination by Machine Learning>

In general, a human observes waveforms and determines normality/abnormality mainly largely depending on experiences. A method for expressing the experience as a mathematical formula and performing the determination on a computer is machine learning. A basic thought of the change detecting method by the machine learning is that a normal distribution of data group (hereinbelow, referred to as sample data) as a reference is produced and it is checked whether data (hereinbelow, referred to as observing data) acquired in an operation stage is out of the normal distribution.

In the data abnormality detection, regarding the sample data, two cases are considered of assuming that all pieces of sample data are normal, and of mixedly including sample data labelled as normal and abnormal. However, in the case of applying the sample data to the secular change of a mechanical part, it is hard to prepare abnormal sample data in advance. Therefore, it is considered to be realistic to assume that all pieces of sample data are normal.

In order to determine that the data is out of the normal distribution, a threshold for determining the data abnormality may be set at the end of the normal distribution and it may be checked whether the observing data is more apart from the center of the normal distribution than the threshold for determining the data abnormality.

<3-2: Time-Series Data>

According to the present embodiment, in the case of acquiring a plurality of types of sample data or observing data, data is acquired as time-series data D defined with the following array.

$$D=\{x^{(1)},y^{(1)}),(x^{(2)},y^{(2)}),\ldots,(x^{(n)},y^{(n)})\}$$

For example, in the case of acquiring, as time-series data, a torque command and an output speed of the respective motors 12 as shown in FIG. 3 with a motor driven mechanism (not shown in particular) that drives the same driving machine 13 by two motors 12 (that is, the degree M of freedom is equal to the number of variable types and equal to two), the time-series data D is as follows. However, the index of D represents time.

$$D_0=\{(0,0),(0,0)\}$$

$$D_{0.001}=\{(1,10),(1.2,9)\}$$

$$D_{0.002}=\{(3,50),(2.8,48)\}\ldots.$$

<3-3: Hotelling $T^2$ Method>

According to the present embodiment, as the change detecting method by the machine learning, for example, Hotelling $T^2$ method is applied. The Hotelling $T^2$ method is one of methods of multi-variable analysis that observes in parallel changing waveforms of a plurality of types of data, and processing thereof is performed in the following (process 1) to (process 6).

(Step 1) Determine False Information Rate.

Data includes normal data and abnormal data, but a false information rate α is an index to set abnormal data by checking how data is apart from a normal distribution. For example, in the case that the false information rate is 1%, α is equal to 0.01. Note that, according to probability statics, all pieces of data are normal in the case that the false information rate is zero, and therefore, principally, the false information rate α is not set to zero.

(Step 2) Calculate Chi-Square Distribution.

Assuming the degree M of freedom and a scale factor s=1, a chi-square distribution is calculated by the following formula. Note that, the degree M of freedom is a parameter that designates the number of types of independent sample data (number of variable types in the multi-variable analysis as described above).

$$\chi^2(x\mid M,1)=\frac{1}{2\Gamma\left(\frac{M}{2}\right)}\left(\frac{x}{2}\right)^{\frac{M}{2}-1}e^{-\frac{x}{2}}$$

where Γ represents a gamma function and is defined by the following formula.

$$\Gamma\left(\frac{M}{2}\right)=\int_0^\infty dt\, t^{\frac{M}{2}-1}e^{-t}$$

(Step 3) Calculate Data Abnormality Determining Threshold.

A data abnormality determining threshold $a_w$ is calculated to satisfy the following formula from the false information rate α determined in the (process 1) and the chi-square distribution calculated in the (process 2).

$$1-\alpha=\int_0^{a_{th}} d\chi^2(x|M,1)$$

(Step 4) Calculate Sample Average and Sample Covariance Matrix.

A sample average μ (hat is omitted in the expression, similar in the following) and a sample covariance matrix Σ (hat is omitted in the expression, similar in the following) are calculated from sample data as normal data with the following formulae.

$$\hat{\mu} = \frac{1}{N}\sum_{n=1}^{N} x^{(n)}$$

$$\hat{\Sigma} = \frac{1}{N}\sum_{n=1}^{N} (x^{(n)} - \hat{\mu})(x^{(n)} - \hat{\mu})^T$$

where $x^{(n)}$ is sample data of n-th type.

(Step 5) Calculate Mahalanobis Distance.

A Mahalanobis distance a(x') is calculated from the following formula based on the sample average t and the sample covariance matrix Σ calculated in the (process 4) and the detected observing data.

$$a(x')=(x'-\hat{\mu})^T\hat{\Sigma}^{-1}(x',-\hat{\mu})$$

(Step 6) Compare Data Abnormality Determining Threshold with Mahalanobis Distance.

The data abnormality determining threshold $a_{th}$ calculated in the (process 3) is compared with the Mahalanobis distance a(x') calculated in the (process 5). In the case that the Mahalanobis distance a(x') exceeds the data abnormality determining threshold $a_{th}$ (a(x')>$a_{th}$), it is determined that the observing data used in the (process 5) is in a data abnormality state.

As shown in FIG. 4, a chi-square distribution is a probability distribution in which the distribution changes for each degree M of freedom, and is preferably applied to multi-variable analysis with characteristics of so-called reproductivity. For example, in the case of acquiring time-series data in which the number of variable types (torque command or output speed) is two, as shown in FIG. 3, the degree M of freedom is equal to 2 and the chi-square distribution shown by a solid line in FIG. 4 is used. In the case that the Mahalanobis distance a(x') is larger than the data abnormality determining threshold ah, corresponding to the false information rate α in the chi-square distribution, it is assumed that data abnormality occurs in the observing data used for calculation of the Mahalanobis distance a(x'). That is, in the multi-variable analysis with two variable types, it is determined that the degree (degree at which how far it is from the normal state) of multi-abnormality due to combination of two pieces of data is determined by one-dimensionally comparing the data abnormality determining threshold $a_{th}$ with the Mahalanobis distance a(x'). Note that the influence due to correlation between the normal distributions of the two types of data is offset by using the sample average and the sample covariance matrix Σ in the case of calculating the Mahalanobis distance a(x') Note that, even in the case of acquiring the time-series data D as shown in FIG. 3, the data abnormality determination of the Hotelling $T^2$ method with the degree of freedom=1 for the type of data can be individually applied.

<3-4: Specific Data Abnormality Detection>

First, as a comparative example, a method for detecting data abnormality without using machine learning will be described.

(Preparation)

1: Acquire a plurality of pieces of normal data as sample data.

2: Produce a normal distribution at each time from a group of sample data.

3: Set a data abnormality determining threshold to the normal distribution at each time.

(Detection Data Abnormality)

1: Acquire observing data.

2: Add to a normal distribution corresponding to acquisition time.

3: Determine abnormality in the case that the observing data exceeds the data abnormality determining threshold set to the normal distribution.

With the method in the comparative example, the normal distribution and the data abnormality determining threshold need to be produced at each time, and the normal distribution of the observing data further needs to be calculated. The calculation of the normal distribution needs the calculation of the average and the standard deviation. However, the calculation of the standard deviation is complicated. Therefore, it is not realistic to perform the calculation at each time. Further, the data abnormality determining threshold is also set to the normal distribution at each time, and therefore has a value varying depending on the time.

Subsequently, a description will be given of the case of using the machine leaning to solve the problem in the comparative example. Processing is as follows by using the machine learning.

(Preparation)

1: Acquire a plurality of pieces of normal data as sample data.

2: Calculate the sample average p and the sample covariance matrix Σ from the group of sample data.

3: Calculate the data abnormality determining threshold $a_{th}$ from the false information rate α and the chi-square distribution.

(Detection Data Abnormality)

1: Acquire observing data.

2: Calculate Mahalanobis distance a(x') with respect to the observing data.

3: Detection data abnormality in the case that the Mahalanobis distance a(x') exceeds the data abnormality determining threshold $a_{th}$.

With the method using the machine learning, in place of calculation of the normal distribution, the sample average p, the sample covariance matrix Σ, and the Mahalanobis distance a(x') are calculated. Since the calculation is simply four arithmetic operations, sequential calculation for a short period does not cause processing with large load during actual operation time of the motor driven mechanism 1 for a long time. Further, although the calculation formula of the data abnormality determining threshold $a_{th}$ is complicated, the data abnormality determining threshold am is a constant that does not depend on the time. Therefore, the data abnormality determining threshold $a_{th}$ may be calculated once in advance.

<4: Determination of Mechanical Abnormality>

With the data abnormality detection, it is possible to binarily determine whether the abnormality state is present/ absent (that is, abnormal/normal) on data at the time point when the time-series data is acquired. However, as shown in an experiment result, which will be described later, although the data abnormality is detected once, it should not be determined that the mechanical abnormality occurs in the whole mechanical system. Further, in the case that the data abnormality occurs plural times, contents of the mechanical abnormality can be estimated primarily based on the generation aspect. In the present embodiment, in the case that the frequency of generation of the data abnormality (data abnormality frequency) exceeds a predetermined value based on a consideration that the frequency of generation of the data abnormality is gradually increased as the aging determination advances, it is determined that the mechanical abnormality of a type of the aging deterioration occurs in the motor driven mechanism 1.

<5: Specific Control Flow>

Hereinbelow, a specific description will be given of an exemplary control flow for determining the mechanical abnormality due to the aging deterioration as described above. FIG. 5 is a flowchart showing an example of a control sequence of preparation processing corresponding to the preparation in the case of using the machine learning for the data abnormality detection. The flowchart is executed by a CPU (corresponding to a first calculator, not shown in particular) in the setup PC 5 shown in FIG. 1 in a normal driving state of the motor driven mechanism 1 in which the data abnormality is not almost caused. Note that, as the normal driving, the driving is considered, for example, in a state (initial operation or test operation) of an operation substantially as designed while the motor driven mechanism 1 is sufficiently adjusted after assembly manufacturing.

First, in process S5, the CPU in the setup PC 5 determines the false information rate $\alpha$. The false information rate $\alpha$ may be arbitrarily determined by an input from the user or be determined by a value calculated based on a preset value or a predetermined method.

Subsequently, in process S10, the CPU in the setup PC 5 calculates the chi-square distribution with the degree M of freedom as the number of variable types. In the present embodiment, two types of the time-series data of the torque command and the output speed are acquired for one motor 12. Therefore, the degree M of freedom is equal to 2.

Subsequently, in process S15, the CPU in the setup PC 5 calculates the data abnormality determining threshold $a_{th}$ based on the false information rate $\alpha$ and the chi-square distribution.

Subsequently, in process S20, the CPU in the setup PC 5 starts the normal driving of the motor driven mechanism 1 by motion control and the motor driving control via the host controller 3 and the servo amplifier 2.

Subsequently, in process S25, the CPU in the setup PC 5 acquires the time-series sample data of each variable (torque command and output speed of each axis) for each predetermined time such as a system cycle via the servo amplifier 2 and the host controller 3.

Subsequently, in process S30, the CPU in the setup PC 5 determines whether or not the normal driving ends. In the case that the normal driving does not end, the determination is not satisfied, the processing returns to process S25, and the similar sequence is repeated.

On the other hand, in the case that the normal driving ends, the determination is satisfied and the processing shifts to process S35.

In process S35, the CPU in the setup PC 5 stops the normal driving of the motor driven mechanism 1.

Subsequently, in process S40, the CPU in the setup PC 5 calculates the sample average $\mu$ and the sample covariance matrix $\Sigma$ from a group of the time-series sample data acquired in process S25. Then, the flow ends.

With the flow of the preparation processing, in particular, the preparation processing (processes 1 to 4) of the machine learning with large load of calculation processing is performed in advance by the setup PC 5 with relatively high CPU-power, and resource burden in the whole abnormality determining system 100 is reduced.

Subsequently, FIG. 6 is a flowchart showing an exemplary control sequence of aging deterioration determining processing in which the data abnormality detection and the mechanical abnormality determination are performed. The flowchart is executed by the CPU (corresponding to a second calculator; not shown in particular) of the host controller 3 shown in FIG. 1 during the drive state of the observation drive of the motor driven mechanism 1 in which the data abnormality can be caused. Note that, as the observation drive, the driving is considered, for example, in a state (processing operation) in which the motor driven mechanism 1 is operated for a sufficiently long time.

First, in process S105, the CPU of the host controller 3 starts the observation drive of the motor driven mechanism 1 by the motion control and the motor driving control via the servo amplifier 2.

Subsequently, in process S110, the CPU of the host controller 3 acquires the time-series observing data of each variable (torque command and output speed of each axis) for each predetermined time such as a system cycle via the servo amplifier 2.

Subsequently, in process S115, the CPU of the host controller 3 calculates the Mahalanobis distance a(x') from the sample average t and the sample covariance matrix $\Sigma$ that are calculated in advance in process S40 and a group of the time-series observing data acquired in process S110.

Subsequently, in process S120, the CPU of the host controller 3 determines whether or not the Mahalanobis distance a(x') calculated in process S115 exceeds the data abnormality determining threshold $a_{th}$ (abbreviated to a 'threshold' in the diagram) calculated in advance in process S15. In other words, the CPU of the host controller 3 determines whether or not the time-series observing data acquired in process S110 is in the data abnormality state. In the case that the Mahalanobis distance a(x') does not exceed the data abnormality determining threshold at, the determination is not satisfied and the processing shifts to process S125. In other words, it is assumed that the data abnormality is not generated.

In process S125, the CPU of the host controller 3 determines whether or not the observation drive ends. In the case that the observation drive does not end, the determination is not satisfied, the processing returns to process S110, and the similar sequence is repeated.

On the other hand, in the case that the observation drive ends, the determination is satisfied, and the processing shifts to process S130.

In process S130, the CPU of the host controller 3 stops the observation drive of the motor driven mechanism 1. Then, the flow ends.

On the other hand, in the case that the Mahalanobis distance a(x') exceeds the data abnormality determining threshold $a_{th}$ in the determination in process S120, the determination is satisfied and the processing shifts to process S135. In other words, it is assumed that the data abnormality occurs.

In process S135, the CPU of the host controller 3 determines whether or not the frequency of determination (frequency for acquiring the time-series observing data determined as abnormality) of the abnormality is higher than a predetermined value (predetermined threshold) in the data abnormality detection that has been performed recently a predetermined number of times. In other words, the CPU of the host controller 3 determines whether or not the mechanical abnormality of the aging deterioration occurs. In the case that the frequency of data abnormality detection at the recent predetermined number of times is larger than the predetermined value, the determination is satisfied and the processing shifts to process S140. In other words, it is assumed that the mechanical abnormality of the aging deterioration occurs.

In process S140, the CPU of the host controller 3 sends the determination result indicating that the aging deterioration occurs in the motor driven mechanism 1 to the operator 4, and reports the result to a display part or the like. Then, the processing shifts to process S130.

On the other hand, in the case that the frequency of data abnormality detection is a predetermined value or less at a nearest predetermined number of times in the determination in process S135, the determination is not satisfied, and the processing shifts to process S125. In other words, it is assumed that the mechanical abnormality of the aging deterioration is not generated.

In the flow of the aging deterioration determining processing, the host controller 3 with a relatively low CPU-power also can perform the determining processing (processes 5 and 6) of the machine learning with a relatively low load of the calculation processing and the mechanical abnormality determining processing. The resource load of the whole abnormality determining system 100 can be reduced. Moreover, during execution (during processing operation) of the aging deterioration determining processing, the setup PC 5 does not perform any processing and is not required. Therefore, by detaching the setup PC 5 from the host controller 3, the entire configuration of the abnormality determining system 100 is simplified and the robustness is improved.

Note that, processes S25 and S110 correspond to an embodiment of acquiring time-series data, processes S5, S10, S15, S40, S115, and S120 correspond to an embodiment of detecting data abnormality, and process S135 corresponds to an embodiment of determining whether mechanical abnormality occurs. Moreover, process S5 corresponds to an embodiment of determining a false information rate, process S10 corresponds to an embodiment of calculating a chi-square distribution, process S15 corresponds to an embodiment of calculating a data abnormality determining threshold, process S40 corresponds to an embodiment of calculating the sample average and the sample covariance matrix, process S115 corresponds to an embodiment of calculating the Mahalanobis distance, and process S120 corresponds to an embodiment of detecting data abnormality in the time-series data, and means for detecting the data abnormality in the time-series data. Further, process S135 corresponds to an embodiment of determining whether mechanical abnormality of the motor driven mechanism occurs, and means for determining the mechanical abnormality of the motor driven mechanism occurs.

<6: Check Data Abnormality Determination with Experiment>

<6-1: Applying Result to Time-Axis Waveform>

The validity of the method for detecting the data abnormality according to the present embodiment is checked by applying the method to the time-axis waveform acquired in a real test. In the real test, the torque command and the output speed at a specific position of a ball screw slider (not shown in particular) that moves in the vertical direction were detected 20 times as the time-series sample data. With the same slider, at a different position, the torque command and the output speed were detected as the time-series observing data.

<6-1-1: Processing with Degree M of Freedom=1>

FIG. 7 shows an example of a graph plotting the time-series sample data and the time-series observing data of the output speed. A solid line in central curves shows the time-series sample data, and another white-intermittent broken curve shows the time-series observing data (similarly in the following diagrams). Note that an example shown in FIG. 7 shows the time-series sample data and the time-series observing data that are substantially overlapped. Moreover, downward, the data abnormality detection result in single-variable analysis (degree M of freedom=1) with the false information rate $\alpha=1\%$ is plotted as a binary graph (High/Low). The number of points of trace data in the experiment is 1000. Therefore, the data abnormality detection is calculated at each point. In the case that the time is different at the same speed, the position of a ball screw is different. Therefore, it is considered that characteristics of the mechanical system are different. Furthermore, FIG. 8 is an example of a graph plotting the time-series sample data, the time-series observing data, and the data abnormality detection results of the torque command, in place of the output speed in FIG. 7.

As a first comparative example, in the case that the machine learning is not used, the data abnormality detection based on the normal distribution shown in FIGS. 9 to 12 is performed. FIGS. 9 and 10 show examples of a normal distribution of the time-series sample data of the output speed and the time-series observing data at times A1 and A2 in FIG. 7. Moreover, FIGS. 11 and 12 show examples of a normal distribution of the time-series sample data of the torque command and the time-series observing data at times B1 and B2 in FIG. 8, respectively. In FIG. 9, the time-series observing data is assumed as normal data for existence inside the normal distribution. On the other hand, the time-series observing data in FIG. 10 is assumed as abnormal data for existence outside the normal distribution. Similarly, the time-series observing data in FIG. 11 is assumed as normal data, and the time-series observing data in FIG. 12 is assumed as abnormal data. As a basic idea in the case that the machine learning is not used, the comparison between the normal distribution and the time-series observing data is performed for all pieces of data. However, actually performing the comparison gives extremely large calculation processing burden and therefore is not realistic.

In FIG. 7, for example, 57 points (5.7%) of the time-series observing data in 1000 points are determined as data abnormality. In FIG. 8, 59 points (5.9%) are determined as data abnormality. As long as viewing only the waveform curve, it is hard to visually determine the difference. In FIGS. 13 and 14 respectively corresponding to FIGS. 7 and 8, the Mahalanobis distance a(x') calculated in the (process 5) is compared with the data abnormality determining threshold $a_{th}$ calculated in (process 3). Viewing graphs plotted in FIGS. 13 and 14, it is obvious to determine whether or not the time-series observing data is out of the time-series sample data.

FIGS. 15 and 16 are easier to understand and are results corresponding to FIGS. 7 and 8 in the case of oscillation with the same ball screw slider. In FIGS. 7 and 8, the data abnormality detection result showing repetition of High/

Low at short intervals continuously shows the data abnormality (High) in FIGS. 15 and 16.

<6-1-2: Processing with Degree M of Freedom=2>

FIGS. 7 to 16, each with the degree M of freedom=1, show the case of detecting the data abnormality with respect to an individual signal of the output speed or the torque command. On the other hand, in the case of detecting multi-dimensional data abnormality in multi-variable analysis with the degree M of freedom=2, the data abnormality determining threshold $a_{th}$ may be calculated with the degree M of freedom=2 in the (process 3), and compared with the Mahalanobis distance a(x') calculated by the square root of the sum of the squares of the output speed and the torque command.

FIG. 17 shows an example of a graph for comparing the Mahalanobis distance a(x') with the data abnormality determining threshold a& in the case of the degree M of freedom=2 under conditions in FIGS. 7 and 8. Comparing FIG. 17 with FIGS. 13 and 14, obviously, the Mahalanobis distance a(x') exceeds the data abnormality determining threshold am at a time when the time-series observing data of the output speed or the torque command is largely apart from the time-series sample data.

<6-2: Applying Result to Frequency-Axis Waveform>

In <6-1>, the method for detecting the data abnormality is applied to a frequency-axis waveform (that is, time domain). In the following, a method using the machine learning with the degree M of freedom=1 is applied to data with frequency characteristics having a frequency axis as the abscissa. Frequency measurement is executed 20 times in a state in which a movable slider is positioned, for example, near the opposite motor-side of the ball screw, and is acquired as the time-series sample data. Subsequently, the frequency measurement is executed in a state in which the movable slider is positioned, for example, near the motor side of the ball screw, and is acquired as the time-series observing data. That is, a nearest predetermined number of each time-series data is analyzed with a frequency, and the data abnormality is detected in a frequency domain.

FIGS. 18 and 19 show examples of graphs acquired by plotting the time-series sample data and the time-series observing data on the frequency axis with gain characteristics and phase characteristics, respectively. Moreover, on the bottoms of FIGS. 18 and 19, results of the data abnormality detection with a set false information rate α=1% are also binarily (High/Low) plotted. Note that, for comparison, FIGS. 20 and 21 show examples of graphs on the frequency axis of the gain characteristics and the phase characteristics of the time-series observing data in the case that mechanical analysis is executed at the same position as that of the time-series sample data. In FIG. 18, the data abnormality is detected at 178 points (44%) of data at 401 points. In FIG. 19, the data abnormality is detected at 185 points (46%). On the other hand, in FIG. 20, the data abnormality is detected at 30 pints (7.5%) and, in FIG. 21, the data abnormality is detected at 34 points (8.5%). An obvious difference can be checked.

<7: Advantages of the Present Embodiment>

As described above, the abnormality determining system 100 of the present embodiment acquires the time-series data on an input or an output of the motor 12 during driving of the motor driven mechanism 1 with sequences in processes S25 and S110. Further, the abnormality determining system 100 detects the data abnormality of the time-series data in sequences in processes S5, S10, S15, S40, S115, and S120. Further, the abnormality determining system 100 determines the mechanical abnormality of the motor driven mechanism 1 based on the acquisition aspect of the time-series data determined as the data abnormality with the sequence in process S135. That is, in the case of applying prediction diagnosis to motion-system mechanical control of electrical motor driving, the data abnormality is distinguished from the mechanical abnormality, and the mechanical abnormality is determined based on a generation aspect (acquisition aspect of the time-series data determined as data abnormality) of the data abnormality. As a result, irrespective of the change of fine data abnormality, the mechanical abnormality of the whole mechanical system is effectively, specifically, and clearly determined.

Note that the acquisition aspect of the time-series data of the data abnormality referred in the case of determining the mechanical abnormality is not limited to the frequency of acquisition. In addition, it is possible to apply various acquisition aspects (determination aspects) such as acquisition combination of acquisition time, an acquisition frequency, and abnormal data depending on the mechanical abnormality of a determination target.

Further, particularly in the present embodiment, the motor 12 is drive-controlled by feedback control based on a motion equation. The time-series data includes at least any one of the torque command input to the motor 12 and the output speed output by the motor 12. As a result, in the case of performing the normal driving and the observation drive with the same driving operation, the time-series data can be acquired simply and properly, and an operation state of a mechanical part of the motor driven mechanism 1 can be specifically verified. Note that, in the case of detecting the data abnormality, even in the case of acquiring an output position, in place of the output speed, as the time-series data, a similar result is acquired.

Furthermore, particularly in the present embodiment, the type of the mechanical abnormality is determined. As a result, it is clear to determine which type of mechanical abnormality occurs in the mechanical system, and handling of the mechanical abnormality by the user is easy.

Moreover, particularly in the present embodiment, the abnormality determining system 100 determines the aging deterioration of the motor driven mechanism 1 as the type of the mechanical abnormality with the sequence in process S135. As a result, it is clear for the user to perform handling of the aging deterioration for improvement of the mechanical abnormality, and the convenience is improved.

In addition, particularly in the present embodiment, the abnormality determining system 100 determines that the mechanical abnormality of the aging deterioration occurs with the sequence in process S135 in the case that the frequency for acquiring the time-series observing data determined as the data abnormality exceeds a predetermined value. As a result, the mechanical abnormality of the aging deterioration can be determined with high reliability.

Note that, based on consideration that the frequency of generation of the data abnormality is gradually increased as the aging deterioration advances, the aging deterioration may be determined with another determination standard. For example, in the case that the frequency for acquiring the time-series observing data determined as the data abnormality tends to be increased each time of the observation drive of the motor driven mechanism 1, it may be determined that the mechanical abnormality of the aging deterioration occurs. Specifically, each time of the observation drive, the frequency for acquiring the time-series observing data determined as the data abnormality is calculated and the history is recorded. In the case that it is determined that the frequency of acquisition tends to be increased with comparison between the nearest-past observation drives, it may be determined that the mechanical abnormality of the aging deterioration occurs.

Additionally, in the case of grasping a causal relationship between the characteristics of the mechanical abnormality and the determination aspect of the data abnormality, it is possible to determine the mechanical abnormality of the type other than the aging deterioration as the type of the mechanical abnormality. For example, as shown in FIGS. 15 and 16, the oscillation of the motor driven mechanism 1 may be determined as the type of the mechanical abnormality. As a result, clearly, the user may perform the handling of the oscillation to improve the mechanical abnormality, and the convenience is improved.

Further, as the determination reference of the oscillation, in the case of continuously acquiring the time-series data determined as the data abnormality over a predetermined period, there is a method for determining the generation of the mechanical abnormality of the oscillation. As a result, the abnormality determining system 100 can determine the oscillation with high possibility.

In addition, in the case of detecting the data abnormality of both the torque command and the output speed, there is also a method for determining that the mechanical abnormality of the oscillation occurs. Thus, the abnormality determining system 100 can determine the oscillation with high possibility. Further, it is possible to determine the mechanical abnormality of another type based on the combination of the normality and the abnormality of the data determined on the torque command and the output speed with the degree M of freedom equal to 1, that is, the acquisition combination (acquisition aspect) of the time-series data determined as the data abnormality. Specifically, as shown in FIG. 22, in the case that the torque command is data abnormality and the output speed is data normality, it is assumed that the torque is fluctuated to keep the output speed against high friction force. Therefore, the mechanical abnormality of disturbance suppression is determined. Further, in the case that the torque command is the data normality and the output speed is the data abnormality, it is assumed that the output speed is fluctuated while torque is kept, that is, the mechanical abnormality of mechanical oscillation is determined. Note that the oscillations may be generated as a result of advancing of the aging deterioration. On the other hand, the oscillations may be generated by an installation mistake or an adjustment mistake also in a new driving machine 13. Therefore, the generation aspect of the data abnormality may contribute to estimating a generation cause of the mechanical abnormality.

Further, particularly in the present embodiment, the abnormality determining system 100 detects the data abnormality with the Hotelling $T^2$ method. As a result, it is possible to realize the data abnormality determination by multi-variable analysis with high reliability.

Furthermore, particularly in the present embodiment, the abnormality determining system 100 calculates the sample average p and the sample covariance matrix $\Sigma$ based on the time-series sample data acquired at the time of normal driving with the Hotelling $T^2$ method. Further, the abnormality determining system 100 calculates the Mahalanobis distance a (x') based on the time-series observing data acquired at the time of observation drive as well as the sample average p and the sample covariance matrix $\Sigma$. Further, the abnormality determining system 100 detects the data abnormality of the time-series observing data with comparison between the Mahalanobis distance a (x') and the data abnormality determining threshold $a_{th}$. As a result, it is possible to execute the machine learning with the Hotelling $T^2$ method in so-called 'learning with a teacher', thereby improving the reliability of the data abnormality detection. Note that the machine learning may be used in so-called 'learning without a teacher' such as clustering.

Furthermore, particularly in the present embodiment, it is preferable to check the mechanical abnormality in consideration of displacement and arrangement such as the output position of the motor 12 by detecting the data abnormality in the time domain.

Note that, as shown in FIGS. 18 to 21, the data abnormality may be detected in the frequency domain. In this case, it is preferable to check the mechanical abnormality in consideration of a kind of parts or causes.

Moreover, particularly in the present embodiment, as shown in FIGS. 7, 8, and 13 to 21, time-axis waveforms or frequency-axis waveforms of the time-series data and the detection result of the data abnormality are superimposed and displayed on the same screen of the operator 4, thereby largely contributing to estimation of the type of mechanical abnormality, generation position, cause, or the like.

In addition, particularly in the present embodiment, the CPU in the setup PC 5 executes the preparation processing in FIG. 5, and the CPU in the host controller 3 executes the aging deterioration determining processing in FIG. 6. The different CPUs share and execute the preparation processing and the aging deterioration determining processing as described above. As a result, processing burdens in the respective CPUs are reduced, and the processing speed and the reliability of the data abnormality detection are improved at the time of observation drive.

Additionally, particularly in the present embodiment, the setup PC 5 that executes the preparation processing can be separated from the host controller 3 at the time of observation drive (at execution time of the aging deterioration determining processing). As a result, hardware resources of the whole system at the time of observation drive can be reduced and robustness can be improved.

Note that the sharing of the respective processing such as the preparation processing and aging deterioration determining processing and the detection of data abnormality and determination of mechanical abnormality in the respective CPUs is not limited to the embodiment. For example, any combination of the respective CPUs in the servo amplifier 2, the host controller 3, and the setup PC 5 may execute the processing, and may execute the processing with the sharing thereof.

<8. Modification>

Note that the disclosed embodiment is not limited to the above, and can be variously modified without departing from the essentials and technical spirits thereof. For example, advantageously, data except for the torque command and the output speed (output position) is acquired as the time-series data to detect the data abnormality. For example, as shown in FIG. 23 corresponding to FIG. 2, the output of the disturbance observer 27 may be acquired as the time-series data to detect the data abnormality. The disturbance observer 27 in the example shown in FIG. 23 estimates disturbance added to the motor 12 based on the torque command and the output speed and outputs the result. As a result, in the case of different driving operations of the normal driving and the observation drive, proper time-series data can be acquired, excluding the influence of the acceleration.

In addition, in the case that the output speed (output position) output by the motor 12 is constant, as shown in FIG. 24, the speed deviation may be acquired as the time-series data to detect the data abnormality. As a result, in the case of performing the normal driving and the observation drive with different driving operations, proper time-series data excluding the influence of speed can be acquired.

Further, in the embodiment, the example of the case has been described in which the host controller 3 performs the position control for inputting a position command to the servo amplifier 2. However, the disclosure is not limited to this, and can be also applied to a case of speed control for inputting a speed command. In this case, the servo amplifier 2 may include only a speed control feedback loop having a subtractor, a speed control part, a current control part, and a speed converting part.

Moreover, although not shown in particular, the motor 12 included in the motor driven mechanism 1 may be a direct-operating type linear motor. In this case, in place of the encoder 11, a linear scale is used, and a thrust command is acquired as the time-series data instead of the torque command.

It is noted that if terms "vertical," "parallel," "plane," etc. are used in the above description, these terms are not used in the exact meanings thereof. Specifically, these terms "vertical," "parallel," and "plane" allow tolerances and errors in design and manufacturing and have meanings of "approximately vertical," "approximately parallel," and "approximately plane."

It is noted that if terms "same," "equal," "different," etc. in relation to a dimension, a size, a shape and a position of the appearance are used in the above description, these terms are not used in the exact meaning thereof. Specifically, these terms "same," "equal," and "different" allow tolerances and errors in design and manufacturing and have meanings of "approximately the same," "approximately equal," and "approximately different."

Techniques by the embodiment and each modified example may be appropriately combined and utilized in addition to the examples having already described above. Although exemplification is not performed one by one, the embodiment and each modified example are carried out by various changes being applied thereto without departing from the technical idea of the present disclosure.

What is claimed is:

1. An abnormality determining apparatus for a motor driven mechanism, comprising:
   circuitry configured to:
   acquire time-series observing data with respect to an input to and an output from the motor which drives the motor driven mechanism in an observation state, the time-series observing data comprising a plurality of observing data points acquired in a time series manner;
   determine whether each of the observing data points of the time-series observing data acquired have data abnormality; and
   determine, based on at least one of a frequency of acquisition of the observing data points that are determined to have the data abnormality, an acquisition time of the observing data points that are determined to have the data abnormality, an acquisition frequency of the observing data points that are determined to have the data abnormality, and continuously acquiring period of the observing data points that are determined to have the data abnormality, whether mechanical abnormality in the motor driven mechanism occurs, wherein the circuitry is configured to:
   calculate a data abnormality determining threshold;
   calculate a sample average based on time-series sample data acquired by driving the motor driven mechanism in a normal state of the motor driven mechanism;
   calculate a sample covariance matrix based on the time-series sample data;
   calculate a Mahalanobis distance based on the sample average, the sample covariance matrix, and the time-series observing data acquired by driving and observing the motor driven mechanism; and
   determine the data abnormality of the observing data point based on comparison between the data abnormality determining threshold and the Mahalanobis distance.

2. The abnormality determining apparatus according to claim 1,
   wherein the circuitry is configured to determine a kind of the mechanical abnormality based on an acquisition combination of the observing data point which is determined to have the data abnormality when it is determined that the mechanical abnormality occurs.

3. The abnormality determining apparatus according to claim 2,
   wherein the circuitry is configured to determine aging deterioration of the motor driven mechanism as the kind of the mechanical abnormality.

4. The abnormality determining apparatus according to claim 3,
   wherein the circuitry is configured to determine that the mechanical abnormality of the aging deterioration occurs, in a case that the frequency of acquisition of the observing data points that are determined to have the data abnormality exceeds a threshold frequency, or in a case that the frequency of acquisition of the observing data points that are determined to have the data abnormality tends to increase each time the circuitry drives and observes the motor driven mechanism.

5. The abnormality determining apparatus according to claim 2,
   wherein the circuitry is configured to determine oscillation of the motor driven mechanism as the kind of the mechanical abnormality.

6. The abnormality determining apparatus according to claim 5,
   wherein the circuitry is configured to determine that the mechanical abnormality of the oscillation occurs in a case that the observing data points that are determined to have the data abnormality are continuously acquired over a threshold period.

7. The abnormality determining apparatus according to claim 5,
   wherein the circuitry is configured to determine that the mechanical abnormality of the oscillation occurs in a case that the observing data points in both a torque command to be inputted to the motor and an output speed to be outputted by the motor are determined to have the data abnormality.

8. The abnormality determining apparatus according to claim 1,
   wherein the circuitry is configured to determine the data abnormality of the observing data point with Hotelling's T2 method.

9. The abnormality determining apparatus according to claim 1, wherein the circuitry is configured to:
  determine a false information rate;
  calculate a chi-square distribution;
  calculate the data abnormality determining threshold based on the false information rate and the chi-square distribution.

10. The abnormality determining apparatus according to claim 1,
  wherein the circuitry is configured to determine the data abnormality of the observing data point in a time domain.

11. The abnormality determining apparatus according to claim 1,
  wherein the circuitry is configured to determine the data abnormality of the observing data point in a frequency domain.

12. The abnormality determining apparatus according to claim 1,
  wherein the circuitry is configured to superimpose and display a time-axis waveform or a frequency-axis waveform of the time-series observing data and a determination result of the data abnormality of the observing data point on a same screen.

13. An abnormality determining method for a motor driven mechanism, comprising:
  acquiring time-series observing data with respect to an input to and an output from a motor which drives the motor driven mechanism in an observation state, the time-series observing data comprising a plurality of observing data points acquired in a time series manner;
  determining whether each of the observing data points of the time-series observing data acquired have data abnormality; and
  determining, based on at least one of a frequency of acquisition of the observing data points that are determined to have the data abnormality, an acquisition time of the observing data points that are determined to have the data abnormality, an acquisition frequency of the observing data points that are determined to have the data abnormality, and continuously acquiring period of the observing data points that are determined to have the data abnormality, whether mechanical abnormality in the motor driven mechanism occurs,
  wherein determining whether each of the observing data points of the time-series observing data acquired have data abnormality comprises:
    calculating a data abnormality determining threshold;
    calculating a sample average based on time-series sample data acquired by driving the motor driven mechanism in a normal state of the motor driven mechanism;
    calculating a sample covariance matrix based on the time-series sample data;
    calculating a Mahalanobis distance based on the sample average, the sample covariance matrix, and the time-series observing data acquired by driving and observing the motor driven mechanism; and
    determining the data abnormality of the observing data point based on comparison between the data abnormality determining threshold and the Mahalanobis distance.

14. An abnormality determining system for a motor driven mechanism, comprising:
  a first calculator to
    determine a false information rate,
    calculate a chi-square distribution,
    calculate a data abnormality determining threshold based on the false information rate and the chi-square distribution,
    acquire time-series sample data with respect to an input to and an output from a motor which drives the motor driven mechanism while the motor driven mechanism is in a normal state, and
    calculate a sample average and a sample covariance matrix based on the time-series sample data; and
  a second calculator to
    acquire time-series observing data with respect to an input to and an output from the motor by driving and observing the motor driven mechanism,
    calculate a Mahalanobis distance based on the sample average, the sample covariance matrix, and the time-series observing data,
    detect data abnormality in the time-series observing data by comparing the data abnormality determining threshold with the Mahalanobis distance, and
    determine, based on the data abnormality, whether mechanical abnormality in the motor driven mechanism occurs.

15. The abnormality determining system according to claim 14,
  wherein the first calculator is separated from the motor while the motor driven mechanism is being driven and observed.

16. A motor control apparatus for a motor which drives a motor driven mechanism, comprising:
  circuitry configured to:
    acquire time-series observing data with respect to an input to and an output from the motor which drives the motor driven mechanism in an observation state, the time-series observing data comprising a plurality of observing data points acquired in a time series manner;
    determine whether each of the observing data points of the time-series observing data acquired have data abnormality; and
    determine, based on at least one of a frequency of acquisition of the observing data points that are determined to have the data abnormality, an acquisition time of the observing data points that are determined to have the data abnormality, an acquisition frequency of the observing data points that are determined to have the data abnormality, and continuously acquiring period of the observing data points that are determined to have the data abnormality, whether mechanical abnormality in the motor driven mechanism occurs,
  wherein the circuitry is configured to:
    calculate a data abnormality determining threshold;
    calculate a sample average based on time-series sample data acquired by driving the motor driven mechanism in a normal state of the motor driven mechanism;
    calculate a sample covariance matrix based on the time-series sample data;
    calculate a Mahalanobis distance based on the sample average, the sample covariance matrix, and the time-series observing data acquired by driving and observing the motor driven mechanism; and
    determine the data abnormality of the observing data point based on comparison between the data abnormality determining threshold and the Mahalanobis distance.

* * * * *